United States Patent
Lee

(10) Patent No.: US 10,937,488 B2
(45) Date of Patent: Mar. 2, 2021

(54) ELECTRONIC CIRCUIT CAPABLE OF SELECTIVELY COMPENSATING FOR CROSSTALK NOISE AND INTER-SYMBOL INTERFERENCE

(71) Applicant: SAMSUNG ELECTRONICS CO., LTD., Suwon-si (KR)

(72) Inventor: Soomin Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 9 days.

(21) Appl. No.: 16/543,765

(22) Filed: Aug. 19, 2019

(65) Prior Publication Data

US 2020/0243129 A1 Jul. 30, 2020

(30) Foreign Application Priority Data

Jan. 28, 2019 (KR) .................. 10-2019-0010550

(51) Int. Cl.
*H04L 1/00* (2006.01)
*H04L 25/03* (2006.01)
*G11C 11/4096* (2006.01)
*H03M 9/00* (2006.01)

(52) U.S. Cl.
CPC ........ *G11C 11/4096* (2013.01); *H04L 1/0033* (2013.01); *H04L 25/03343* (2013.01); *H04L 25/03853* (2013.01); *H03M 9/00* (2013.01); *H04L 25/03025* (2013.01)

(58) Field of Classification Search
CPC ... G11C 11/4096; G11C 7/02; G11C 11/4093; G11C 7/1084; H04L 1/0033; H04L 25/03343; H04L 25/03853; H04L 25/03025; H03M 9/00
See application file for complete search history.

(56) References Cited

U.S. PATENT DOCUMENTS

| | | | |
|---|---|---|---|
| 6,480,021 B2 | 11/2002 | Deas et al. | |
| 7,260,155 B2 | 8/2007 | Stonick et al. | |
| 8,027,409 B2 | 9/2011 | Aziz et al. | |

(Continued)

OTHER PUBLICATIONS

Seung-Jun Bae, et al., "A 40nm 2Gb/s/pin GDDR5 SDRAM with a programmable DQ Ordering Crosstalk Equalizer and Adjustable Clock-Tracking BW", 2011 IEEE International Solid-State Circuits Conference, pp. 498-499, 2011.

*Primary Examiner* — Gene N Auduong
(74) *Attorney, Agent, or Firm* — F. Chau & Associates, LLC

(57) ABSTRACT

An electronic circuit including: a driver for outputting a driven first signal by driving a first signal among signals received in parallel; a selector circuit for selecting one of the first signal and a second signal among the signals received in parallel; and a compensator circuit for generating a first compensation signal for compensating the driven first signal, in response to the first signal or the second signal selected by the selector circuit, wherein, when the selector circuit selects the first signal, the compensator circuit generates the first compensation signal to compensate for an inter-symbol interference of the driven first signal, and wherein, when the selector circuit selects the second signal, the compensator circuit generates the first compensation signal to compensate for a crosstalk noise of the driven first signal caused by a driven second signal driven from the second signal.

20 Claims, 16 Drawing Sheets

(56) References Cited

U.S. PATENT DOCUMENTS

| | | |
|---|---|---|
| 8,588,331 B2 | 11/2013 | Jung et al. |
| 8,938,376 B2 | 1/2015 | Hollis |
| 8,941,411 B2 | 1/2015 | Jeong et al. |
| 2011/0317564 A1* | 12/2011 | Saibi ................. H04L 43/50 |
| | | 370/249 |
| 2012/0207196 A1* | 8/2012 | Zerbe ............. H04L 25/03343 |
| | | 375/219 |
| 2012/0266048 A1* | 10/2012 | Chung ................. G06F 11/08 |
| | | 714/768 |
| 2014/0062612 A1 | 3/2014 | Jeong et al. |

\* cited by examiner

ELECTRONIC CIRCUIT CAPABLE OF SELECTIVELY COMPENSATING FOR CROSSTALK NOISE AND INTER-SYMBOL INTERFERENCE

CROSS-REFERENCE TO RELATED APPLICATION

This application claims priority under 35 U.S.C. § 119 to Korean Patent Application. No. 10-2019-0010550 filed on Jan. 28, 2019, in the Korean Intellectual Property Office, the disclosure of which is incorporated by reference herein in its entirety.

TECHNICAL FIELD

The present inventive concept relates to an electronic circuit, and more particularly, to configurations and operations of an electronic circuit for transmitting a data signal.

DISCUSSION OF RELATED ART

In general, an electronic device performs unique functions depending on operations of various electronic circuits included in the electronic device. The electronic device and the electronic circuit may operate independently or may operate while communicating with another electronic device or another electronic circuit.

As the amount of data that are exchanged between electronic devices increases, an electronic circuit (e.g., a communication circuit) capable of transmitting and receiving signals at high speed is used. Electronic devices are connected through a communication channel, and signals that are transmitted and received between the electronic devices are transferred through the communication channel. When a plurality of communication channels are used, signals may be transmitted and received in parallel through the plurality of communication channels. Therefore, the performance of communication may be further increased.

However, a noise may occur due to various physical factors. For example, a signal that is transferred through one communication channel may be distorted to have an unintended waveform due to a physical characteristic of the communication channel. In addition, the signal may be distorted due to influence of another communication channel. When this happens, the quality of signals that are transferred at high speed may be reduced, and communication errors may result.

SUMMARY

In exemplary embodiments of the present inventive concept, an electronic circuit includes: a first driver for outputting a driven first signal by driving a first signal among signals received in parallel; a first selector circuit for selecting one of the first signal and a second signal among the signals received in parallel; and a first compensator circuit for generating a first compensation signal for compensating the driven first signal, in response to the first signal or the second signal selected by the first selector circuit, wherein, when the first selector circuit selects the first signal, the first compensator circuit generates the first compensation signal to compensate for an inter-symbol interference of the driven first signal, and wherein, when the first selector circuit selects the second signal, the first compensator circuit generates the first compensation signal to compensate for a crosstalk noise of the driven first signal caused by a driven second signal driven from the second signal.

In exemplary embodiments of the present inventive concept, an electronic circuit for transmitting an output signal includes: a driver for receiving a first signal and outputting a driven first signal; and a compensator circuit for receiving one selected from the first signal and a second signal received in parallel with the first signal, and for outputting a first compensation signal to compensate for an inter-symbol interference of the driven first signal in response to the first signal or for outputting a second compensation signal to compensate for a crosstalk noise of the driven first signal in response to the second signal.

In exemplary embodiments of the present inventive concept, an electronic circuit includes: a driver for driving a first signal of signals received in parallel; a selector circuit for selecting one of the first signal and a second signal among the signals received in parallel; and a compensator circuit for compensating for a first noise occurring in the driven first signal in response to the first signal selected by the selector circuit or compensating for a second noise of the driven first signal caused with regard to the second signal in response to the second signal selected by the selector circuit.

In exemplary embodiments of the present inventive concept, an electronic circuit includes: a driver for driving a first signal and outputting a driven first signal; a selector circuit for selecting one of the first signal and a second signal received in parallel with the first signal; and compensator circuits for generating first compensation signals to compensate for an inter-symbol interference of the driven first signal based on the first signal or generating second compensation signals to compensate for a crosstalk noise of the driven first signal caused by a driven second signal driven from the second signal based on the second signal, according to a selection of the selector circuit, wherein, when an influence of the inter-symbol interference or the crosstalk noise of the driven first signal changes, waveforms of the first compensation signals or the second compensation signals change.

In exemplary embodiments of the present inventive concept, an electronic circuit includes: a driver for driving a first signal and outputting a driven first signal; selector circuits each for selecting one of the first signal and a second signal received in parallel with the first signal; and compensator circuits respectively connected with the selector circuits and each for generating a first compensation signal to compensate for an inter-symbol interference of the driven first signal based on the first signal or generating a second compensation signal to compensate for a crosstalk noise of the driven first signal caused by a driven second signal driven from the second signal based on the second signal, according to a selection of one of the selector circuits connected to the compensator circuit.

In exemplary embodiments of the present inventive concept, an electronic circuit includes: a driver for receiving a first signal and outputting a driven first signal; a selector circuit for receiving the first signal and a second signal and selecting one of the first signal and the second signal; and a compensator circuit for generating a compensation signal to compensate the driven first signal, in response to the first signal or the second signal selected by the first selector circuit, wherein, when the selector circuit selects the first signal, the compensator circuit generates the compensation signal to compensate for a first distortion influencing the driven first signal, and wherein, when the selector circuit selects the second signal, the compensator circuit generates the compensation signal to compensate for a second distortion influencing the driven first signal.

BRIEF DESCRIPTION OF THE DRAWINGS

The above and other features of the present inventive concept will become apparent by describing in detail exemplary embodiments thereof with reference to the accompanying drawings.

DETAILED DESCRIPTION OF THE EMBODIMENTS

Figure 1:
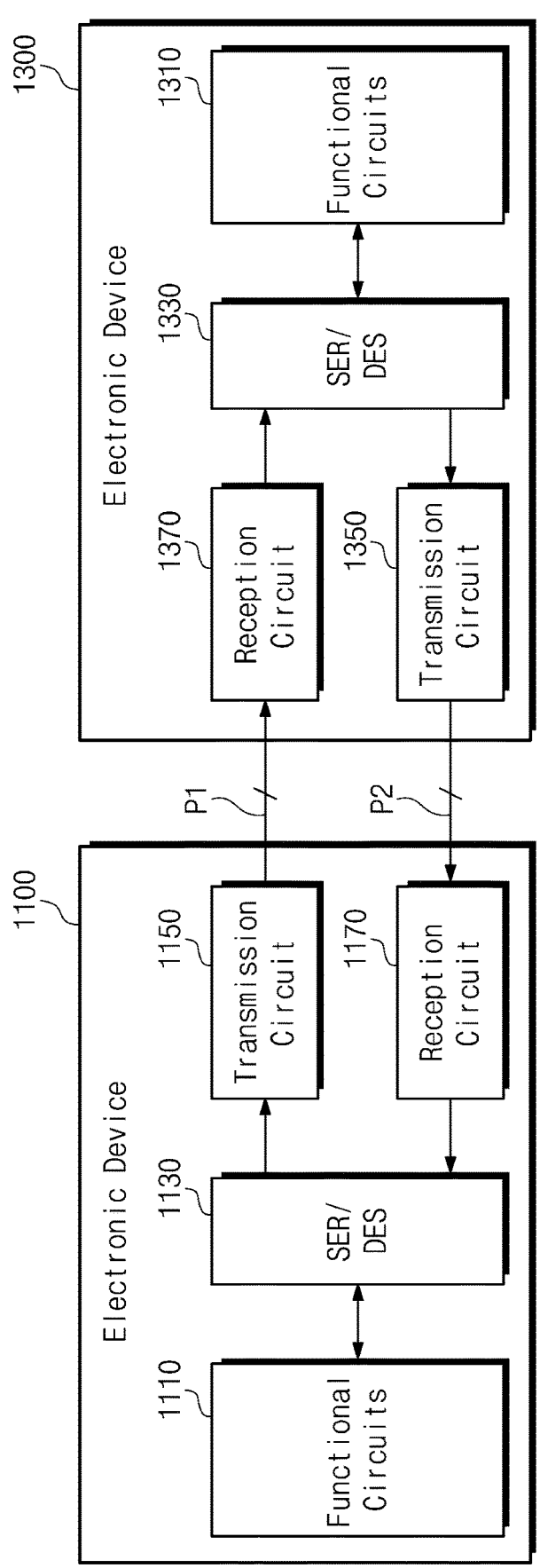
FIG. 1 is a block diagram illustrating a configuration of an electronic system including an electronic circuit according to exemplary embodiments of the present inventive concept.

FIG. 1 is a block diagram illustrating a configuration of an electronic system 1000 including an electronic circuit according to exemplary embodiments of the present inventive concept.

The electronic system 1000 may include electronic devices 1100 and 1300. In exemplary embodiments of the present inventive concept, each of the electronic devices 1100 and 1300 may be one of various electronic devices such as a desktop computer, a laptop computer, a tablet computer, a smartphone, a wearable device, a video game console, an electric vehicle, home appliances, and a medical device.

However, the present inventive concept may not be limited thereto. In other exemplary embodiments of the present inventive concept, the electronic system 1000 may be a single electronic device. In these embodiments, each of the electronic devices 1100 and 1300 may be a component or an intellectual property (IP) included in a single electronic device, and may be an entity of a circuit, module, chip, and/or package level.

The electronic devices 1100 and 1300 may communicate with each other, in other words, the electronic devices 1100 and 1300 may exchange data signals through communication paths P1 and P2. The communication paths P1 and P2 may include a plurality of communication channels for transferring data signals in parallel, which will be described with reference to FIG. 2.

The electronic device 1100 may include functional circuits 1110, a serializer/deserializer SER/DES 1130, a transmission circuit 1150, and a reception circuit 1170. The electronic de rice 1300 may include functional circuits 1310, a SER/DES 1330, a transmission circuit 1350, and a reception circuit 1370.

The functional circuits 1110 and 1310 may provide unique functions of the electronic devices 1100 and 1300. For example, the functional circuits 1110 and 1310 may constitute various components or IPs such as a processor (e.g., a central processing unit (CPU) and an application processor (AP)), a memory, an image sensor, and a display. The functional circuits 1110 and 1310 may process signals in various manners to provide the unique functions. In this regard, each of the functional circuits 1110 and 1310 may be called a "processing circuit" or a "processor".

The SER/DES 1130 may serialize data that are generated according to operations of the functional circuits 1110. The transmission circuit 1150 may output a signal that corresponds to the data serialized by the SER/DES 1130. The output signal may be transmitted from the electronic device 1100 to the electronic device 1300 through the communication path P1.

The reception circuit 1370 may receive a signal through the communication path P1. The SER/DES 1330 may deserialize data of the signal received by the reception circuit 1370. The deserialized data may correspond to the data generated by the functional circuits 1110. The SER/DES 1330 may provide the deserialized data to the functional circuits 1310. The functional circuits 1310 may operate based on the provided data.

The SER/DES 1330 may serialize data that are generated according to operations of the functional circuits 1310. The transmission circuit 1350 may output a signal that corresponds to the data serialized by the SER/DES 1330. The output signal may be transmitted to the electronic device 1100 from the electronic device 1300 through the communication path P2.

The reception circuit 1170 may receive a signal through the communication path P2. The SER/DES 1130 may deserialize data of the signal received by the reception circuit 1170. The deserialized data may correspond to the data generated by the functional circuits 1310. The SER/DES 1130 may provide the deserialized data to the functional circuits 1110. The functional circuits 1110 may operate based on the provided data.

By using the above-described technique, the electronic devices 1100 and 1300 may exchange data signals with each other through the communication paths P1 and P2. When a speed of communication between the electronic devices 1100 and 1300 increases (e.g., when the transmission circuits 1150 and 1350 and the reception circuits 1170 and 1370 operate at a higher frequency or bandwidth), the electronic devices 1100 and 1300 may exchange a larger amount of data during a unit time. In other words, the performance of communication may be improved.

In addition, when data signals are conveyed in parallel through a plurality of communication channels, a larger amount of data may be transmitted and received during the unit time. A configuration implementing this will be described with reference to FIG. 2.

Figure 2:
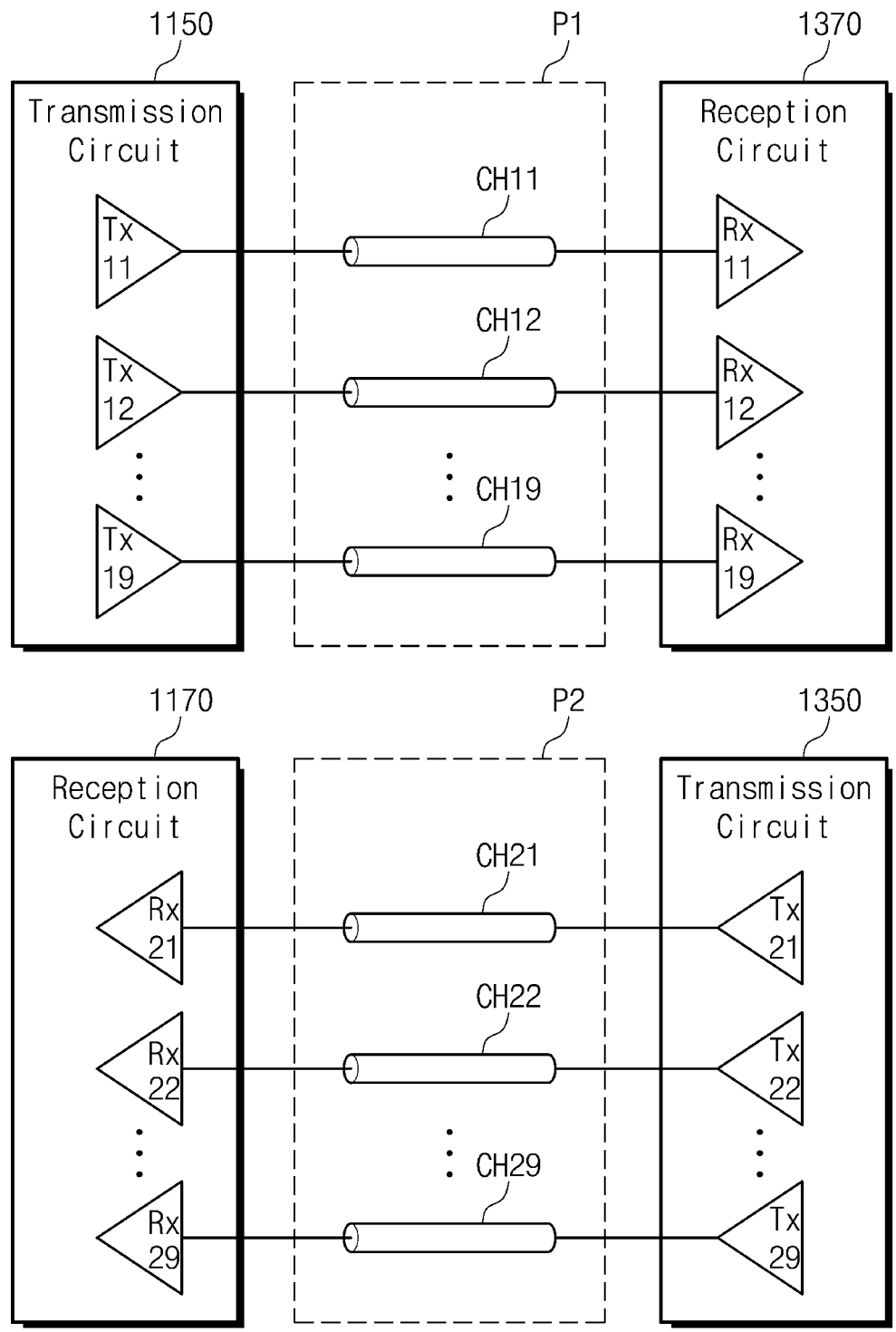
FIG. 2 is a block diagram illustrating a connection between transmission circuits and reception circuits of FIG. 1.

FIG. 2 is a block diagram illustrating a connection between the transmission circuits 1150 and 1350 and the reception circuits 1170 and 1370 of FIG. 1.

The communication paths P1 and P2 may include a plurality of communication channels for transferring data signals in parallel. For example, the communication path P1 may include communication channels CH11 to CH19, and the communication path P2 may include communication channels CH21 to CH29.

Each of the communication channels CH11 to CH19 and CH21 to CH29 may include a conductive material to transfer a signal. For example, each of the communication channels CH11 to CH19 and CH21 to CH29 may be a trace pattern on a printed circuit board (PCB), a conducting wire of a cable, or a metal pin/pad of a connector.

Transmitters Tx11 to Tx19 of the transmission circuit 1150 may be connected to receivers Rx11 to Rx19 of the reception circuit 1370 through the communication channels CH11 to CH19. The communication channels CH11 to CH19 may transfer signals in parallel between the transmitters Tx11 to Tx19 and the receivers Rx11 to Rx19. For example, signals driven by the transmitters Tx11 to Tx19 may be transmitted to the receivers Rx11 to Rx19 in parallel through the communication channels CH11 to CH19.

Transmitters Tx21 to Tx29 of the transmission circuit 1350 may be connected to receivers Rx21 to Rx29 of the reception circuit 1170 through the communication channels CH21 to CH29. The communication channels CH21 to CH29 may transfer signals in parallel between the transmitters Tx21 to Tx29 and the receivers Rx21 to Rx29. For example, signals driven by the transmitters Tx21 to Tx29 may be transmitted to the receivers Rx21 to Rx29 in parallel through the communication channels CH21 to CH29.

The communication channels CH11 to CH19 may be connected in parallel between the transmission circuit 1150 and the reception circuit 1370. In addition, the communication channels CH21 to CH29 may be connected in parallel between the transmission circuit 1350 and the reception circuit 1170. In this regard, the communication channels CH1 to CH19 and CH21 to CH29 may be called "parallel channels".

Compared with the case where a single communication channel is used, the plurality of communication channels CH11 to CH19 and CH21 to CH29 may allow a larger amount of data to be conveyed. Accordingly, the communication channels CH11 to CH19 and CH21 to CH29 may be useful in an environment that conveys a large amount of data quickly.

The transmitters Tx11 to Tx19 may receive data serialized by the SER/DES 1130 in parallel, and may output signals in parallel. The receivers Rx11 to Rx19 may receive signals in parallel, and may provide the received signals to the SER/DES 1330 in parallel. The transmitters Tx21 to Tx29 may receive data serialized by the SER/DES 1330 in parallel, and may output signals in parallel. The receivers Rx21 to Rx29 may receive signals in parallel, and may provide the received signals to the SER/DES 1130 in parallel.

Figure 3:
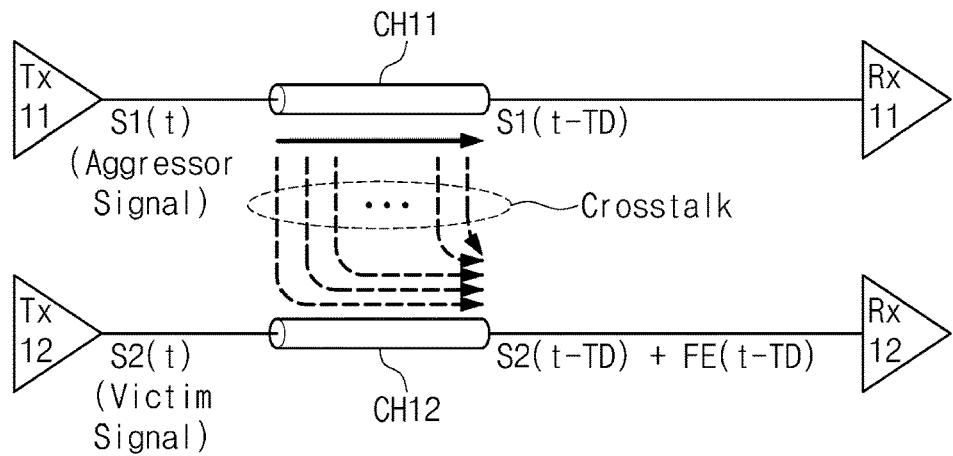
FIG. 3 is a diagram for describing a crosstalk noise that occurs between communication channels of FIG. 2.
Figure 4:
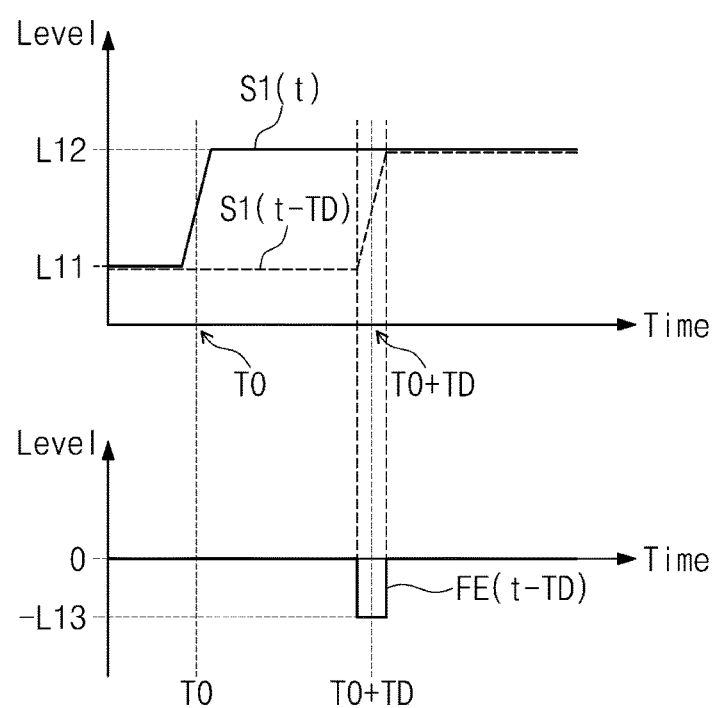
FIGS. 4 and 5 are graphs for describing a far-end crosstalk noise that occurs between communication channels of FIG. 3.
Figure 5:
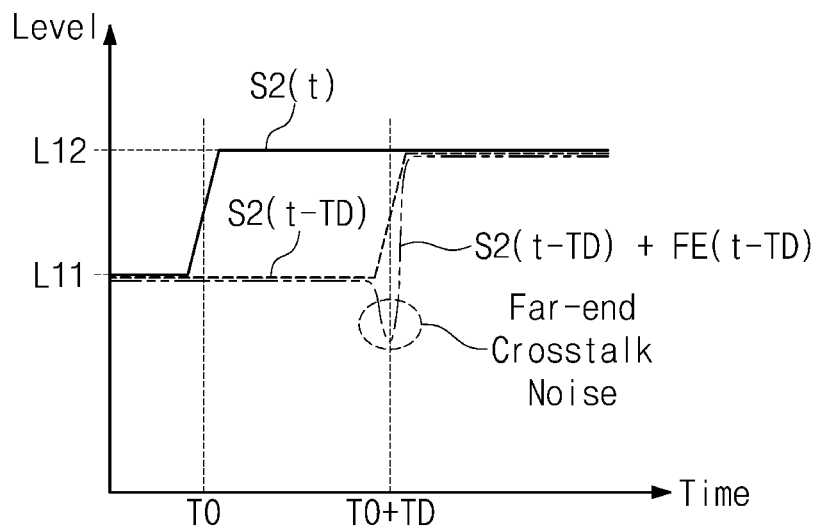
Figure 6:
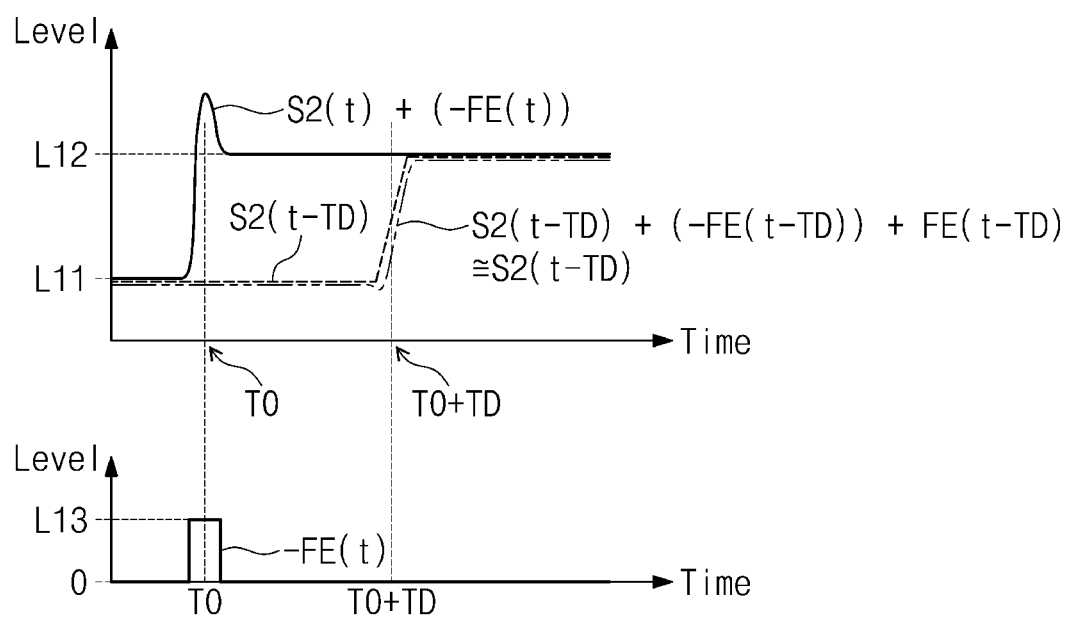
FIG. 6 is a graph for describing how to compensate for a far-end crosstalk noise of FIG. 5.

FIG. 3 is a diagram for describing a crosstalk noise that occurs between the communication channels CH11 to CH19 and CH21 to CH29 of FIG. 2. FIGS. 4 and 5 are graphs for describing a far-end crosstalk noise that occurs between the communication channels CH11 and CH12 of FIG. 3. FIG. 6 is a graph for describing how to compensate for a far-end crosstalk noise of FIG. 5.

FIG. 3 shows the two communication channels CH11 and CH12 of the communication channels CH11 to CH19 and CH21 to CH29, and the transmitters Tx11 and Tx12 and the receivers Tx11 and Rx12 connected through the communication channels CH11 and CH12. It may be understood that the following descriptions may be applied to the remaining communication channels CH13 to CH19 and CH21 to CH29 of FIG. 2.

Referring to FIG. 3, the transmitter Tx11 may transfer a signal $S1(t)$ driven by the transmitter Tx11 to the communication channel CH11. A time delay TD may occur while the signal $S1(t)$ is transmitted to the receiver Rx11 through the communication channel CH11. The receiver Rx11 may receive a signal $S1(t\text{-TD})$ delayed as much as the time delay TD.

The transmitter Tx12 may transfer a signal $S2(t)$ driven by the transmitter Tx12 to the communication channel CH12. The time delay TD may occur while the signal $S2(t)$ is transmitted to the receiver Rx12 through the communication channel CH12. The time delay TD due to a characteristic of the communication channel CH12 may be different from the time delay TD due to a characteristic of the communication channel CH11. However, for ease of description, it is assumed that the time delay TD of the communication channel CH11 is the same as the time delay TD of the communication channel CH12. The receiver Rx12 may be expected to receive a signal $S2(t\text{-TD})$ delayed as much as the time delay TD.

For example, the communication channels CH11 and CH12 may be adjacent to each other in space or may be close to each other in distance. In this case, due to a capacitive coupling and an inductive coupling between the communication channels CH11 and CH12, the transfer of the signal $S1(t)$ through the communication channel CH11 may have an influence on the transfer of the signal $S2(t)$ through the communication channel CH12. In addition, the transfer of the signal $S2(t)$ through the communication channel CH12 may have an influence on the transfer of the signal $S1(t)$ through the communication channel CH11. These influences may cause the crosstalk noise.

For ease of description, the case where the transfer of the signal $S1(t)$ through the communication channel C11 has an influence on the transfer of the signal $S2(t)$ through the communication channel CH12 will be described. In this example, the signal $S1(t)$ may be an aggressor signal, and the signal $S2(t)$ may be a victim signal.

Due to the aggressor signal $S1(t)$, a near-end crosstalk may occur at a transmission end of the communication channel CH12, and a far-end crosstalk may occur at a reception end of the communication channel CH12. For example, the far-end crosstalk may cause a crosstalk noise $FE(t\text{-TD})$ associated with the signal $S2(t\text{-TD})$. Accordingly, the receiver Rx12 may receive a distorted signal "$S2(t\text{-TD})+FE(t\text{-TD}))$", not the signal $S2(t\text{-TD})$.

The influence of the crosstalk noise $FE(t\text{-TD})$ will be understood from FIGS. 4 and 5. Referring to FIG. 4, for example, a level of the signal $S1(t)$ may transition from level L11 to level L12 at a time T0. At a time T0+TD after the time delay TD passes, the receiver Rx11 may receive a delayed signal S1(*t*-TD).

Due to the influence of the far-end crosstalk, at a time T0+TD, the crosstalk noise FE(t-TD) may occur on the channel CH12. As the channel CH12 is continuously affected while the signal S1(*t*) is transferred through the channel CH11, the crosstalk noise FE(t-TD) may include a pulse.

Due to the coupling with the channel CH11, a magnitude of the pulse of the crosstalk noise FE(t-TD) may be proportional to a slope of the signal S1(*t*-TD). In addition, a sign of the pulse of the crosstalk noise FE(t-TD) may be opposite to a sign of the slope of the signal S1(*t*-TD). For example, the pulse of the crosstalk noise FE(t-TD) may have level −L13 at the time T0+TD.

Referring to FIG. 5, for example, a level of the signal S2(*t*) may transition from level L11 to level L12 at a time T0. At a time T0+TD after the time delay TD passes, the receiver Rx12 may be expected to receive a delayed signal S2(*t*-TD). However, due to the crosstalk noise FE(t-TD), the receiver Rx12 may receive a distorted signal "S2(*t*-TD)+FE(t-TD)" at the time T0+TD. The distorted signal "S2(*t*-TD)+FE(t-TD)" may have an unintended waveform that varies with the pulse of the crosstalk noise FE(t-TD). In other words, the waveform of the distorted signal "S2(*t*-TD)+FE(t-TD)" may vary in accordance with the pulse of the crosstalk noise FE(t-TD).

As such, in the case where the receiver Rx12 receives the distorted signal "S2(*t*-TD)+FE(t-TD)" instead of the signal S2(*t*-TD), the quality of signal may decrease, and errors may occur in communication. Accordingly, the embodiments of the present inventive concept may compensate for the crosstalk noise FE(t-TD) such that signal distortion is prevented or minimized. In an exemplary embodiment of the present inventive concept, the crosstalk noise FE(t-TD) may be compensated by applying a signal component having an opposite characteristic to a characteristic of a noise component to an intended signal to completely or partially offset the signal distortion.

Referring to FIG. 6, the embodiments of the present inventive concept may use a compensation signal −FE(t) to compensate the signal S2(*t*). The compensation signal −FE (t) may have a waveform for preventing a waveform of the signal S2(*t*-TD) from being distorted due to the crosstalk noise FE(t-TD). To accomplish this, the compensation signal −FE(t) may be generated such that a characteristic of the compensation signal −FE(t) is opposite to a characteristic of the crosstalk noise FE(t-TD).

For example, the compensation signal −FE(t) may include a pulse having a characteristic opposite to a characteristic of the pulse of the crosstalk noise FE(t-TD). A magnitude of the pulse of the compensation signal −FE(t) may be substantially the same as a magnitude of the pulse of the crosstalk noise FE(t-TD). In addition, a sign of the pulse of the compensation signal −FE(t) may be opposite to a sign of the pulse of the crosstalk noise FE(t-TD). For example, the pulse of the compensation signal −FE(t) may be generated to have level −L13 at the time T0. In addition, the pulse of the compensation signal −FE(t) may be generated to have various other levels, e.g., −L12, −L11.5 or −L11, at the time T0.

For example, a magnitude of the pulse of the compensation signal −FE(t) may be proportional to a slope of the signal S1(*t*-TD). In addition, a sign of the pulse of the compensation signal −FE(t) may be the same as a sign of the slope of the signal S1(*t*-TD). In this regard, in some embodiments of the present inventive concept, the compensation signal −FE(t) may be generated to include a pulse corresponding to a waveform that is obtained by differentiating a waveform of the signal S1(*t*) at the time T0.

As the compensation signal −FE(t) is applied to the signal S2 (*t*) at the time T0, a compensated signal "S2(*t*)+(−FE(t))" may be generated. A direction in which the pulse of the compensation signal −FE(t) compensates for a waveform of the signal S2(*t*) may be opposite to a direction in which a waveform of the signal S2(*t*-TD) is distorted due to the crosstalk noise FE(t). When the compensated signal "S2(*t*)+(−FE(t))" has an influence of the crosstalk noise FE(t-TD). While the compensated signal "S2(*t*)+(−FE(t))" is transferred through the communication channel CH12, the receiver Rx12 may receive a signal "S2(*t*-TD)+(−FE(t-TD))+FE(t-TD)" at the time T0+TD.

A waveform of the signal "S2(*t*-TD)+(−FE(t-TD))+FE(t-TD)" may be substantially the same as or almost similar to a waveform of an intended signal S2(*t*-TD). As such, the compensation signal −FE(t) may compensate for the crosstalk noise FE(t-TD) associated with the signal S2(*t*-TD). Accordingly, the quality of signal may be increase, and errors may be prevented in communication.

Figure 7:
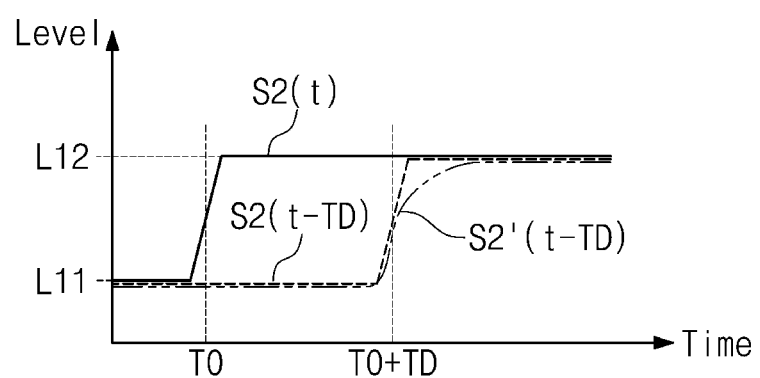
FIG. 7 is a graph for describing characteristics of communication channels of FIG. 2.
Figure 8:
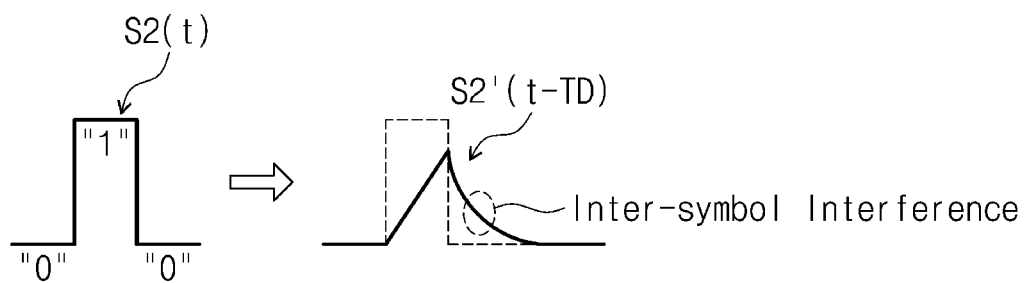
FIGS. 8 and 9 are diagrams for describing an inter-symbol interference for a signal transferred through a communication channel of FIG. 3.
Figure 9:
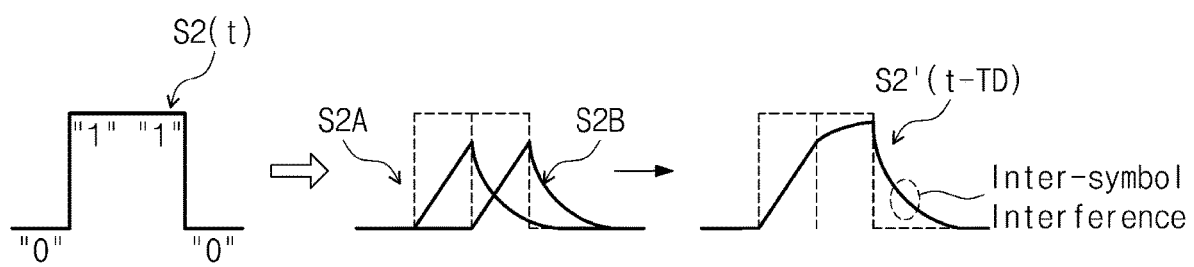
Figure 10:
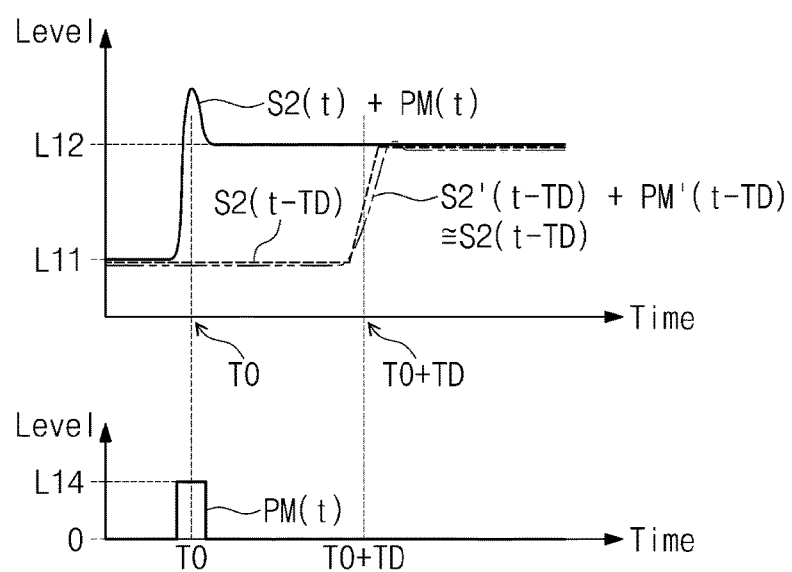
FIG. 10 is a graph for describing how to compensate for an inter-symbol interference of FIG. 9.

FIG. 7 is a graph for describing characteristics of the communication channels CH11 to CH19 and CH21 to CH29 of FIG. 2. FIGS. 8 and 9 are diagrams for describing an inter-symbol interference for the signal S2(*t*) transferred through the communication channel CH12 of FIG. 3. FIG. 10 is a graph for describing how to compensate for an inter-symbol interference of FIG. 9.

FIGS. 7 to 10 will be described with regard to the signal S2(*t*) and the communication channel CH12 illustrated in FIG. 3. However, the descriptions are provided for ease in understanding. It is therefore understood that the following descriptions may be applied to the remaining communication channels CH11, CH13 to CH19 and CH21 to CH29 of FIG. 2.

Referring to FIG. 7, the transmitter Tx12 may transfer a signal S2(*t*) to the communication channel CH12. For example, a level of the signal S2(*t*) may transition from level L11 to level L12 at the time T0. At the time T0+TD after the time delay TD passes, the receiver Rx12 may be expected to receive the delayed signal S2(*t*-TD).

However, due to various factors such as a skin effect and a dielectric loss, the communication channel C12 may have a low-pass frequency response characteristic. Due to this physical characteristic of the communication channel CH12, the receiver Rx12 may receive a distorted signal S2'(*t*-TD) at the time T0÷TD. An intensity of a high-frequency component of the distorted signal S2'(*t*-TD) may be weaker than an intensity of a high-frequency component of the intended signal S2(*t*-TD).

The low-pass frequency response characteristic of the communication channel CH12 will be understood from FIGS. 8 and 9. Referring to FIG. 8, for example, the signal S2(*t*) may be generated to sequentially have signal levels corresponding to logic "0", logic "1", and logic "0". While the signal S2(*t*) of FIG. 8 is transferred from the transmitter Tx12 to the receiver Rx12 through the communication channel CH12, the signal S2(*t*) may be distorted due to the characteristic of the communication channel CH12. Accordingly, a waveform of the signal S2'(*t*-TD) that the receiver Rx12 receives may be different from a waveform of the signal S2(*t*-TD).

Referring to FIG. 9, for example, the signal S2(*t*) may be generated to sequentially have signal levels corresponding to logic "0", logic "1", logic "1", and logic "0". While the signal S2(*t*) of FIG. 9 is transferred from the transmitter Tx12 to the receiver Rx12 through the communication channel CH12, symbols corresponding to logic "1" may be transmitted with waveforms S2A and S2B, due to the characteristic of the communication channel CH12.

The waveforms S2A and S2B may have an influence on each other on a time domain (e.g., an inter-symbol interference), and the signal S2(*t*) may be distorted. Accordingly, a waveform of the signal S2' (*t*-TD) that the receiver Rx12 receives may be different from a waveform of the signal S2(*t*-TD). As such, while the signal S2(*t*) is transferred through the communication channel CH12, a waveform of the signal S2(*t*) may be distorted to be different from an intended waveform.

This may make a high-frequency component of signals transferred through the communication channel CH12 weak, and thus, a bandwidth of the communication channel CH12 may be restricted. In particular, as a speed for transferring signals increases, the signals may become more distorted, and the quality of such signals may decrease. In some cases, incorrect data may be exchanged between the electronic devices 1100 and 1300, and errors may occur in communication. Accordingly, exemplary embodiments of the present inventive concept may compensate for the inter-symbol interference such that signal distortion is prevented or minimized.

Referring to FIG. 10, the embodiments of the present inventive concept may use a compensation signal PM(t) to compensate the signal S2(*t*). The compensation signal PM(t) may have a waveform for preventing a waveform of the signal S2(*t*-TD) from being distorted due to the inter-symbol interference. To accomplish this, the compensation signal PM(t) may be generated such that a characteristic of the compensation signal PM(t) is opposite to a low-pass frequency response characteristic of the channel CH12. For example, the compensation signal PM(t) may include a pulse for pre-emphasizing the signal S2(*t*).

The term "pre-emphasizing" may mean to apply an effect opposite to a characteristic of the communication channel CH12 to the signal S2(*t*) in advance before the transmitter Tx12 transfers the signal S2(*t*) to the communication channel CH12. In this case, a waveform of the signal S2(*t*) changes to an intended waveform (or to a waveform similar to the intended waveform) while the signal S2(*t*) is transferred through the communication channel CH12.

For example, a magnitude of the pulse of the compensation signal PM(t) may be proportional to a slope of the signal S2(*t*-TD). In addition, a sign of the pulse of the compensation signal PM(t) may be the same as a sign of the slope of the signal S2(*t*). For example, the pulse of the compensation signal PM(t) may be generated to have level L14 at the time T0. In this regard, in some embodiments of the present inventive concept, the compensation signal PM(t) may be generated to include a pulse corresponding to a waveform that is obtained by differentiating a waveform of the signal S2(*t*) at the time T0.

As the compensation signal PM(t) is applied to the signal S2(*t*) at the time T0, a compensated signal "S2(*t*)+PM(t))" may be generated. As illustrated in FIG. 7, the signal S2'(*t*-TD) may be distorted such that a level of the signal S2'(*t*-TD) is lower than a level of the intended signal S2(*t*-TD) at the time T0+TD. Accordingly, the compensation signal PM(t) may be generated to pre-distort the signal S2(*t*) such that a level of the compensated signal "S2(*t*)+PM(t)" is higher than the level of the intended signal S2(*t*) at the time T0.

In other words, a direction in which the pulse of the compensation signal PM(t) compensates for a waveform of the signal S2(*t*) may be opposite to a direction in which a waveform of the signal S2(*t*-TD) is distorted due to the inter-symbol interference. When the compensated signal "S2(*t*)+PM(t)" has an influence of the inter-symbol interference while the compensated signal "S2(*t*)+PM(t)" is transferred through the communication channel CH12, the receiver Rx12 may receive a signal "S2'(*t*-TD)+PM' (t-TD)" at the time T0+TD.

A waveform of the signal "S2(*t*-TD)+PM(t-TD)" may be substantially the same as or almost similar to a waveform of the intended signal S2(*t*-TD). As such, the compensation signal PM(t) may compensate for the inter-symbol interference associated with the signal S2(*t*-TD). Accordingly, the quality of signal may be increased, and errors may be prevented in communication.

Although the reduction of the far-end crosstalk noise and the inter-symbol interference are described with reference to FIGS. 3 to 10, the present inventive concept is not limited thereto. For example, signals that are transferred through the communication channels CH11 to CH19 and CH21 to CH29 may be influenced by various types of noises.

For example, a noise having an influence on a signal may include a noise occurring within the signal (e.g., like an inter-symbol interference). The examples described with reference to FIGS. 7 to 10 may be similarly applied to compensate for a noise occurring within a signal.

For example, a noise having an influence on a signal may include a noise that is caused with regard to any other signal (e.g., like a crosstalk noise). The examples described with reference to FIGS. 3 to 6 may be similarly applied to compensate for a noise occurring due to the influence of any other signal.

For ease of description, the following embodiments of the present inventive concept will be described as compensating for a far-end crosstalk noise and an inter-symbol interference. It to be understood, however, that the following embodiments may be variously changed or modified to compensate for different types of noises.

Figure 11:
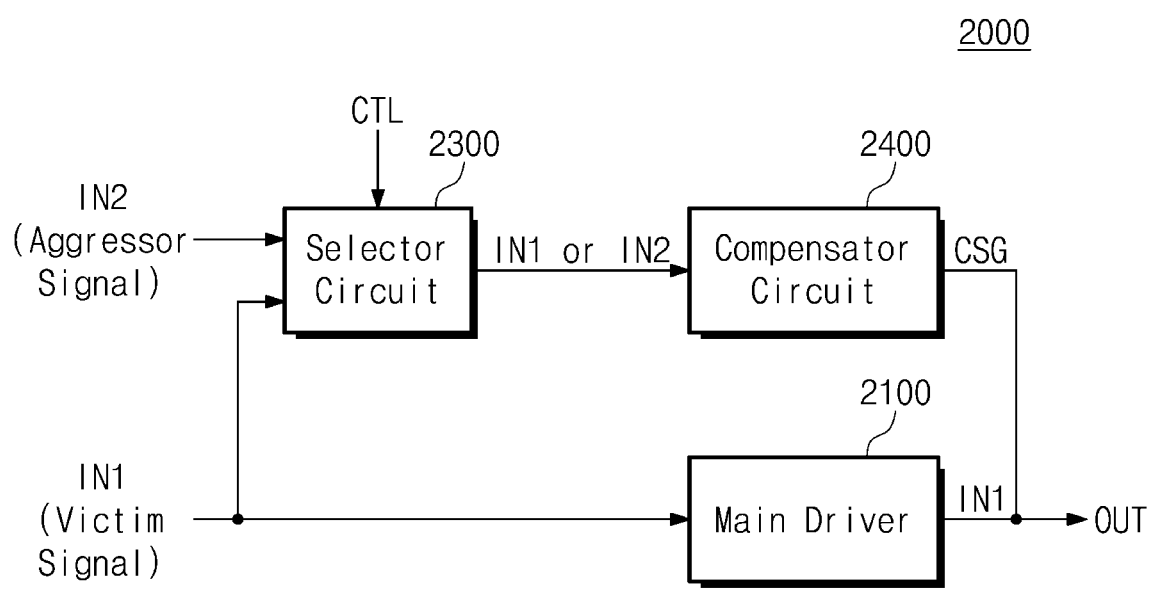
FIG. 11 is a block diagram illustrating a configuration of an electronic circuit included in an electronic system of FIG. 1.

FIG. 11 is a block diagram illustrating a configuration of an electronic circuit 2000 included in the electronic system 1000 of FIG. 1.

Referring to FIG. 11, in exemplary embodiments of the present inventive concept, the electronic circuit 2000 may include a main driver 2100, a selector circuit 2300, and a compensator circuit 2400. The electronic circuit 2000 may be included in the transmission circuit 1150 or 1350 of FIG. 1.

When the transmission circuit 1150 includes the electronic circuit 2000, one electronic circuit 2000 may be provided for each transmitter and for each communication channel. In exemplary embodiments of the present inventive concept, components of the electronic circuit 2000 may be included in each of the transmitters Tx11 to Tx19 of FIG. 2. Alternatively, the main driver 2100 may be included in each of the transmitters Tx11 to Tx19. In addition, the selector circuit 2300 and the compensator circuit 2400 may be provided outside the transmitters Tx11 to Tx19 to correspond to each of the transmitters Tx11 to Tx19.

For ease of description, the case where the transmission circuit 1150 includes the electronic circuit 2000 will be described. It is to be understood that these descriptions may be similarly applied to the case where the transmission circuit 1350 includes the electronic circuit 2000.

The main driver 2100 may receive a signal IN1 of signals received in parallel from the SER/DES 1130. The main driver 2100 may drive the signal IN1 and may output the driven signal IN1.

The selector circuit 2300 may receive signals IN1 and IN2. The signal IN12 may be received in parallel with the signal IN1, and may be one of signals received in parallel from the SER/DES 1130. The selector circuit 2300 may select one of the signals and IN2. For example, the selector circuit 2300 may select the signal IN1 or the signal IN2 in response to a control signal CTL.

The selector circuit 2300 may output one signal selected from the signals IN1 and IN2. For example, the selector circuit 2300 may output the signal IN1 or the signal IN2 based on the control signal CTL. The control signal CTL, will be described with reference to FIGS. 14 to 16.

The compensator circuit 2400 may receive one signal selected by the selector circuit 2300. When the selector circuit 2300 selects the signal IN1 in response to the control signal CTL, the compensator circuit 2400 may receive the signal IN1. When the selector circuit 2300 selects the signal IN2 in response to the control signal CTL, the compensator circuit 2400 may receive the signal IN2.

The compensator circuit 2400 may output a compensation signal CSG based on one signal selected by the selector circuit 2300. The compensation signal CSG may be generated based on the signal IN1 or the signal IN2 to compensate the driven signal IN1. The compensation signal CSG may have a waveform for compensating for a noise associated with the driven signal IN1. For example, the compensation signal CSG may correspond to the compensation signal –FE(t) described with reference to FIG. 6 or the compensation signal PM(t) described with reference to FIG. 10.

As described with reference to FIGS. 3 to 10, the compensation signal CSG may have a waveform that is obtained based on a waveform of the signal IN1 or the signal IN2. Accordingly, the compensator circuit 2400 may be a hardware circuit configured to process the signal IN1 or the signal IN2 to provide an appropriate waveform of the compensation signal CSG.

As the compensation signal CSG is applied to the driven signal IN1, the driven signal IN1 may be compensated based on the compensation signal CSG. An output signal OUT may correspond to the driven signal IN1 that is compensated based on the compensation signal CSG. For example, the output signal OUT may correspond to the compensated signal "S2($t$-TD)+(–FE(t-TD))+FE(t-TD)" described with reference to FIG. 6 or the compensated signal "S2'($t$-TD)+PM'(t-TD)" described with reference to FIG. 10. The electronic circuit 2000 may output the output signal OUT, and may transmit the output signal OUT to a receiver through a communication channel.

Figure 12:
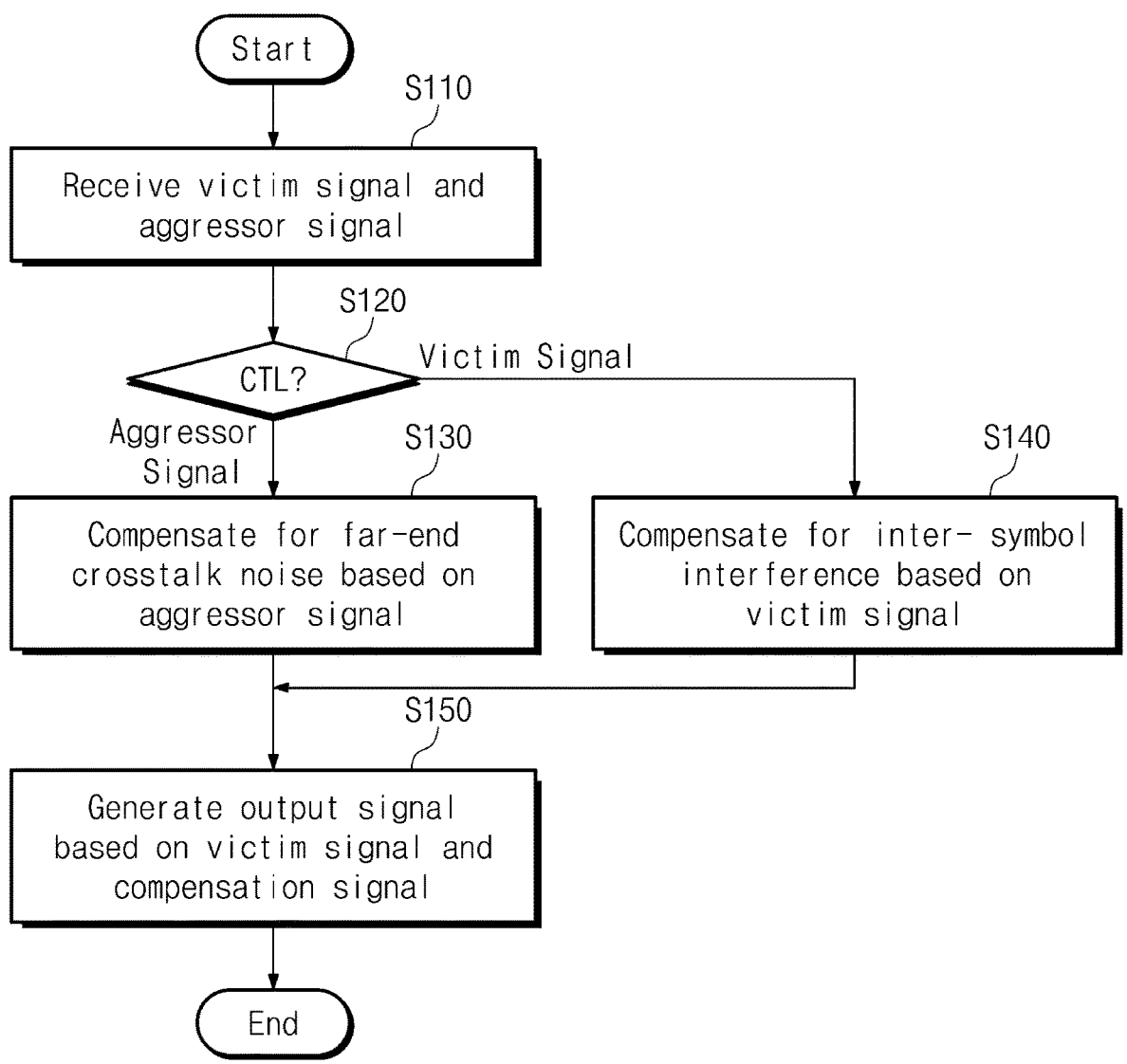
FIG. 12 is a flowchart for describing an operation of an electronic circuit of FIG. 11.

As described with reference to FIGS. 3 to 6, while the driven signal IN1 is transferred through a communication channel, a crosstalk noise may occur in the driven signal IN1 due to a signal driven from the signal IN2. In this case, the signal IN1 may be a victim signal, and the signal IN12 may be an aggressor signal, FIG. 12 is a flowchart for describing an operation of the electronic circuit 2000 of FIG. 11.

For example, the electronic circuit 2000 may receive a victim signal IN1 and an aggressor signal IN2 (S110). The selector circuit 2300 may provide one signal, which is selected based on the control signal CTL, from among the victim signal IN1 and the aggressor signal IN2 to the compensator circuit 2400 (S120).

When the selector circuit 2300 selects the aggressor signal IN2, the compensator circuit 2400 may compensate for a noise (e.g., a hip-end crosstalk noise) of the victim signal IN1 caused with regard to the aggressor signal IN2, based on the aggressor signal IN2 (S130). For example, when the selector circuit 2300 selects the aggressor signal IN2, the compensator circuit 2400 may output the compensation signal CSG based on the aggressor signal IN2.

For example, the compensation signal CSG that is generated based on the aggressor signal IN2 may correspond to the compensation signal –FE(t) described with reference to FIG. 6. The victim signal IN1 may be compensated for a crosstalk noise, which is caused by a signal driven from the aggressor signal IN2, based on the compensation signal CSG corresponding to the compensation signal –FE(t).

When the selector circuit 2300 selects the victim signal IN1, the compensator circuit 2400 may compensate for a noise (e.g., an inter-symbol interference) occurring in the victim signal IN1, based on the victim signal IN1 (S140). For example, when the selector circuit 2300 selects the victim signal IN1, the compensator circuit 2400 may output the compensation signal CSG based on the victim signal IN1.

For example, the compensation signal CSG that is generated based on the victim signal IN1 may correspond to the compensation signal PM(t) described with reference to FIG. 10. The victim signal IN1 may be compensated for the inter-symbol interference, based on the compensation signal CSG corresponding to the compensation signal PM(t).

The electronic circuit 2000 may output the output signal OUT (S150). The output signal OUT may be generated based on the driven signal IN1 and the compensation signal CSG. For example, the output signal OUT may be generated by compensating the driven signal IN1 based on the compensation signal CSG. For example, the electronic circuit 2000 may output the driven signal IN1, which is compensated based on the compensation signal –FE(t) or the compensation signal PM(t), as the output signal OUT. Distortion of the signal IN1 due to a noise (e.g., a crosstalk noise or an inter-symbol interference) may decrease based on the output signal OUT.

Returning to FIG. 11, to perform the above operations, the main driver 2100 and the compensator circuit 2400 may be connected in parallel between a terminal for receiving the signal IN1 and a terminal for outputting the output signal OUT. In this configuration, the compensator circuit 2400 may selectively compensate for different types of noises (e.g., a crosstalk noise and an inter-symbol interference) depending on a selection made by the selector circuit 23000.

In other words, the compensator circuit 2400 may be shared to compensate for different types of noises. Accordingly, a circuit area may be reduced compared to the case where separate compensator circuits are provided.

Compensation signals of the same characteristic may be used to compensate for some types of noises. For example, the compensation signal –FE(t) having a pulse magnitude proportional to a slope of the signal S1($t$) may be used to compensate for the crosstalk noise of FIG. 4. In addition, the compensation signal PM(t) having a pulse magnitude proportional to a slope of the signal S2($t$) may be used to compensate for the inter-symbol interference of FIG. 9. In this example, a direction in which a pulse of the compensation signal –FE(t) compensates for a waveform of the signal S2($t$) may be the same as a direction in which a pulse of the compensation signal PM(t) compensates for a waveform of the signal S2($t$).

As such, the compensator circuit 2400 may be shared to generate compensation signals of the same characteristic. For example, with regard to the examples of FIGS. 3 to 10, the compensator circuit 2400 may be generate the compensation signal CSG having a magnitude proportional to a slope of a signal input to the compensator circuit 2400. However, the signal input to the compensator circuit 2400 may be changed according to a type of a noise that the compensation signal CSG compensates for, and may depend on the selection of the selector circuit 2300.

Figure 13:
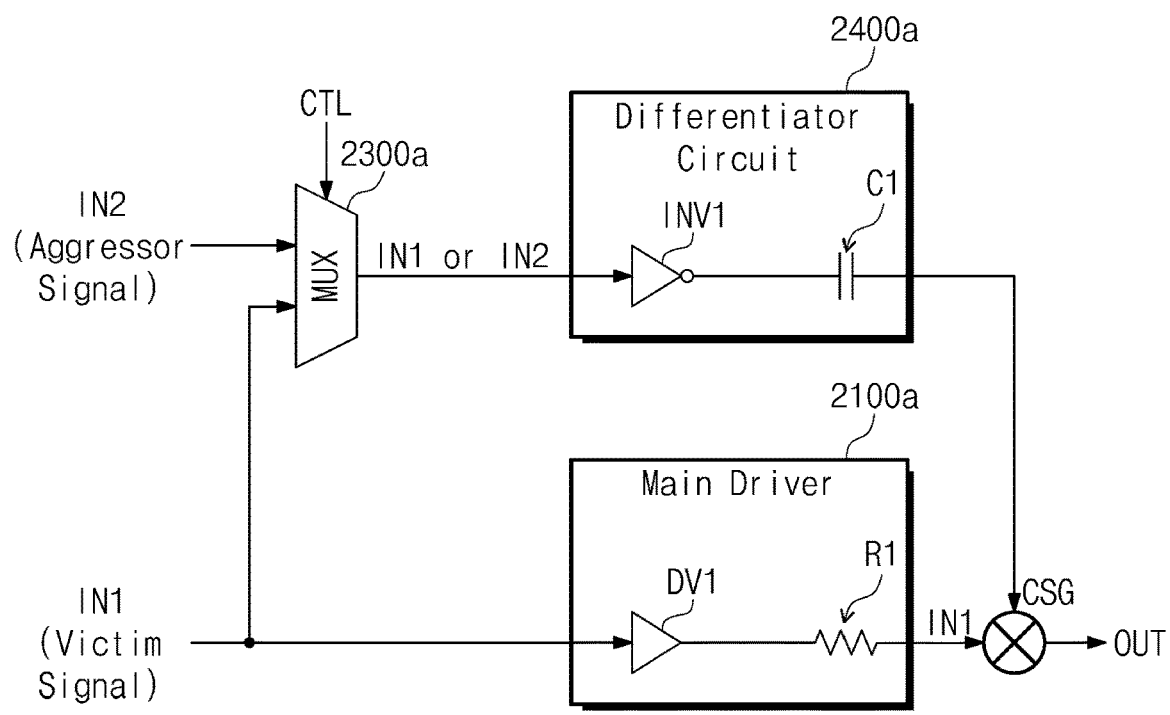
FIG. 13 is a block diagram illustrating a configuration associated with an electronic circuit of FIG. 11.

FIG. 13 is a block diagram illustrating a configuration associated with the electronic circuit 2000 of FIG. 11.

In exemplary embodiments of the present inventive concept, the electronic circuit 2000 of FIG. 11 may be implemented with an electronic circuit 2000a of FIG. 13. The electronic circuit 2000a may include a voltage-mode main driver 2100a, a multiplexer 2300a, and a differentiator circuit 2400a.

The voltage-mode main driver 2100a may correspond to the main driver 2100. The voltage-mode main driver 2100a may include a driver DV1 and a resistance component R1. The voltage-mode main driver 2100a may receive the signal IN1 and may drive the signal IN1 through the resistance component R1 by using the driver DV1. However, the present inventive concept is not limited thereto. For example, a configuration of the main driver 2100 may be variously changed or modified to a current-mode driver or any other implementation.

The multiplexer 2300a may correspond to the selector circuit 2300. The multiplexer 2300a may receive the signals IN1 and IN2, and may selectively output the signal IN1 or the signal IN2 in response to the control signal CTL. However, the present inventive concept is not limited thereto. For example, a configuration of the selector circuit 2300 may be variously changed or modified to a switch circuit, a gate circuit, or any other implementation that can select one of the signals IN1 and IN2.

The differentiator circuit 2400a may correspond to the compensator circuit 2400. The differentiator circuit 2400a may process a signal selected by the selector circuit 2300 to generate the compensation signal CSG. For example, with regard to the example of FIG. 6, in the case where the multiplexer 2300a outputs the signal IN2, the differentiator circuit 2400a may process the signal IN2 such that the compensation signal −FE(t) has a waveform obtained by differentiating a waveform of the signal IN2.

For example, with regard to the example of FIG. 10, in the case where the multiplexer 2300a outputs the signal IN1, the differentiator circuit 2400a may process the signal IN1 such that the compensation signal PM(t) has a waveform obtained by differentiating a waveform of the signal IN1. As such, the differentiator circuit 2400a may be shared to process the signal IN1 and the signal IN2.

For example, the differentiator circuit 2400a may be a cap-peaking type driver including an inverter INV1 and a capacitive element C1. For example, a capacitance of the capacitive element C1 may be fixed or variable.

When the capacitance of the capacitive element C1 is variable, a waveform of the compensation signal CSG that is generated by the differentiator circuit 2400a may be adjustable. In this case, the degree to which the differentiator circuit 2400a compensates for a noise (e.g., a crosstalk noise or an inter-symbol interference) may be variable. For example, when the influence of the noise on the signal IN1 changes (e.g., increases or decreases), a variable capacitance of the capacitive element C1 may be adjusted such that the degree to which the differentiator circuit 2400a compensates for the noise changes (e.g., increases or decreases).

However, the differentiator circuit 2400a of FIG. 13 is only one of various possible embodiments and is not intended to limit the present inventive concept. In exemplary embodiments of the present inventive concept, the differentiator circuit 2400a may include segmented circuits, which will be described with reference to FIGS. 17 to 20. Alternatively, the differentiator circuit 2400a may be variously changed or modified to any other implementation different from a cap-peaking type driver. In exemplary embodiments of the present inventive concept, the compensator circuit 2400 may be variously changed or modified to any other implementation different from the differentiator circuit 2400a to generate an appropriate compensation signal CSG.

Figure 14:
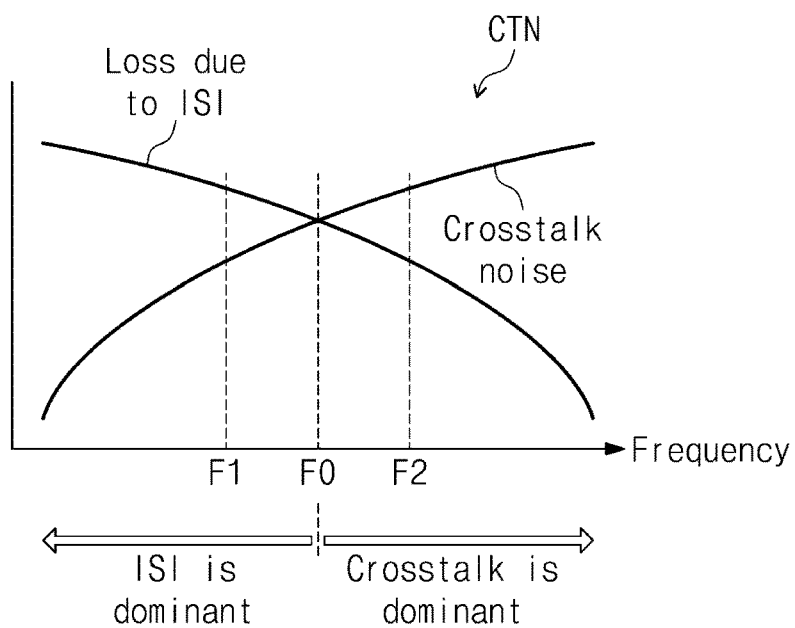
FIG. 14 is a diagram for describing how compensation is made for a far-end crosstalk noise or an inter-symbol interference at an electronic circuit of FIG. 11.

FIG. 14 is a diagram for describing how compensation is made for a far-end crosstalk noise or an inter-symbol interference at the electronic circuit 2000 of FIG. 11.

For example, in a communication environment CTN, as a signal frequency decreases, signal distortion or loss due to an inter-symbol interference may become serious. In contrast, as the signal frequency increases, a crosstalk noise may become serious.

In this communication environment CTN, when the signal frequency is lower than a frequency F0, the inter-symbol interference (ISI in FIG. 14) may be more dominant than the crosstalk noise. In contrast, when the signal frequency is higher than the frequency F0, the crosstalk noise may be more dominant than the inter-symbol interference.

For example, when a signal is transferred through a communication channel at a frequency F1 lower than the frequency F0, the influence of the inter-symbol interference may be greater than the influence of the crosstalk noise. In this case, it may be more advantageous to compensate for the inter-symbol interference. When the control signal CTL is provided such that the selector circuit 2300 selects the signal IN1, the compensator circuit 2400 may receive the signal IN1. The compensator circuit 2400 may generate the compensation signal CSG for compensating for the inter-symbol interference based on the signal IN1.

In contrast, when a signal is transferred through a communication channel at a frequency F2 higher than the frequency F0, the influence of the crosstalk noise may be greater than the influence of the inter-symbol interference. In this case, it may be more advantageous to compensate for the crosstalk noise. When the control signal CTL is provided such that the selector circuit 2300 selects the signal IN2, the compensator circuit 2400 may receive the signal IN2. The compensator circuit 2400 may generate the compensation signal CSG for compensating for the crosstalk noise based on the signal IN2.

The control signal CTL may be provided based on the communication environment CTN, e.g., the control signal CTL may be provided based on the influence of the inter-symbol interference and the influence of the crosstalk noise. However, the communication environment CTN of FIG. 14 is merely one example, and thus, is not intended to limit the present inventive concept. The influence of the inter-symbol interference and the influence of the crosstalk noise may be changed to be different from that shown in FIG. 14 depending on various factors such as a circuit design and an actual operating environment.

Figure 15:
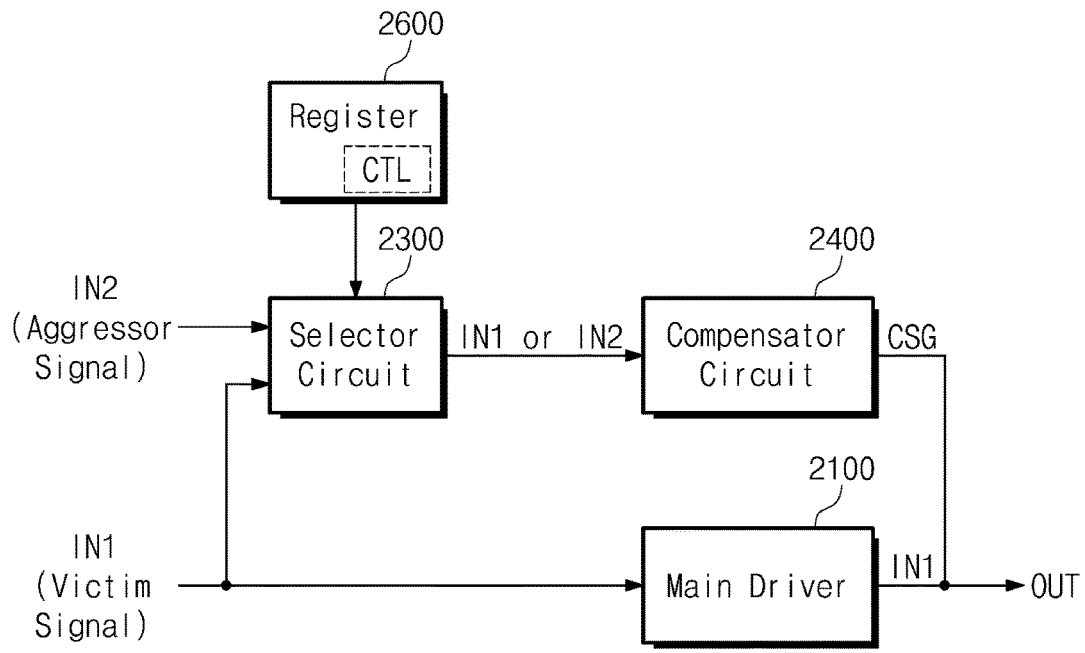
FIGS. 15, 16 and 17 are block diagrams illustrating a configuration associated with an electronic circuit of FIG. 11.

FIG. 15 is a block diagram illustrating a configuration associated with the electronic circuit 2000 of FIG. 11.

In exemplary embodiments of the present inventive concept, the electronic circuit 2000 of FIG. 11 may include an electronic circuit 2000b of FIG. 15. The electronic circuit 2000b may include the main driver 2100, the selector circuit 2300, the compensator circuit 2400, and a register 2600.

For example, before the electronic system 1000 including the electronic circuit 2000b is shipped, the electronic system 1000 may be tested to determine whether it operates normally. Also during the test, it may be determined whether signals are normally transferred through the communication channels CH11 to CH19 and CH21 to CH29. In the test, the influence of the inter-symbol interference and the influence of the crosstalk noise may be measured for each communication channel.

A value corresponding to the control signal CTL may be stored in the register 2600, based on a result of the measurement. The value corresponding to the control signal CTL may be determined based on whether the inter-symbol interference is dominant or whether the crosstalk noise is dominant. The selector circuit 2300 may select one of the signals IN1 and IN2, based on the control signal CTL having the value obtained from the test.

Figure 16:
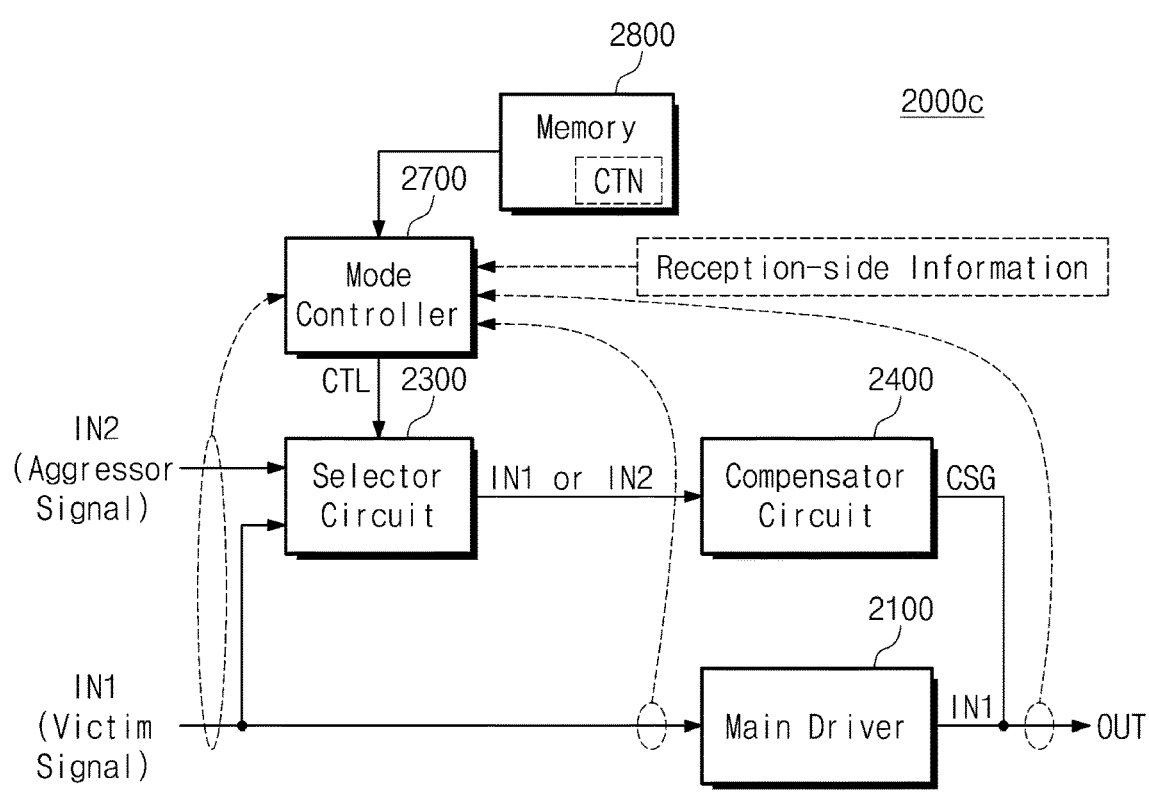

FIG. 16 is a block diagram illustrating a configuration associated with the electronic circuit 2000 of FIG. 11.

In exemplary embodiments of the present inventive concept, the electronic circuit 2000 of FIG. 11 may include an electronic circuit 2000c of FIG. 16. The electronic circuit 2000c may include the main driver 2100, the selector circuit 2300, the compensator circuit 2400, a mode controller 2700, and a memory 2800.

For example, while the electronic system 1000 including the electronic circuit 2000c operates, the mode controller 2700 may monitor flows of signals to measure the inter-symbol interference and the influence of the crosstalk noise. In some cases, a reception-side device that receives signals may provide information associated with a noise of the signals, and the mode controller 2700 may obtain the information provided from the reception-side device.

The memory 2800 may store information about the communication environment CTN. For example, the information about the communication environment CTN may be collected during a test or an actual operation of the electronic system 1000.

The mode controller 2700 may provide the control signal CTL to the selector circuit 2300, based on the information of the communication environment CTN stored in the memory 2800, the monitored flows of signals, and the information provided from the reception-side device. The control signal CTL may be generated based on whether the inter-symbol interference is dominant in a current communication environment or whether the crosstalk noise is dominant in the current communication environment. The selector circuit 2300 may select one of the signals IN1 and IN2, based on whether it is better to compensate for the inter-symbol interference or whether it is better to compensate for the crosstalk noise.

Figure 17:
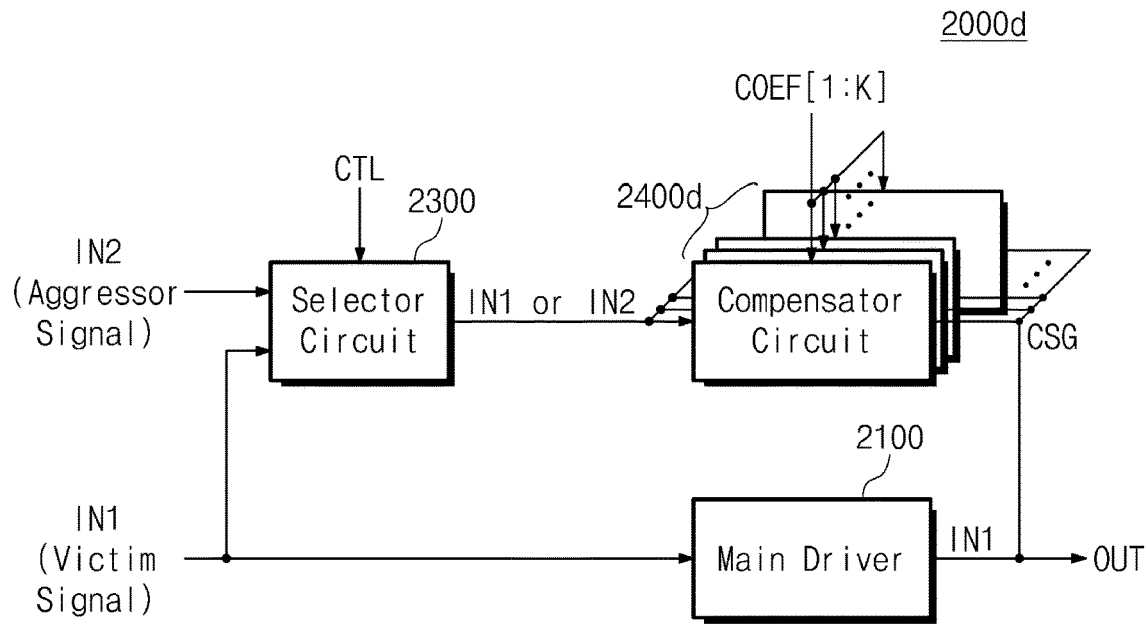
Figure 18:
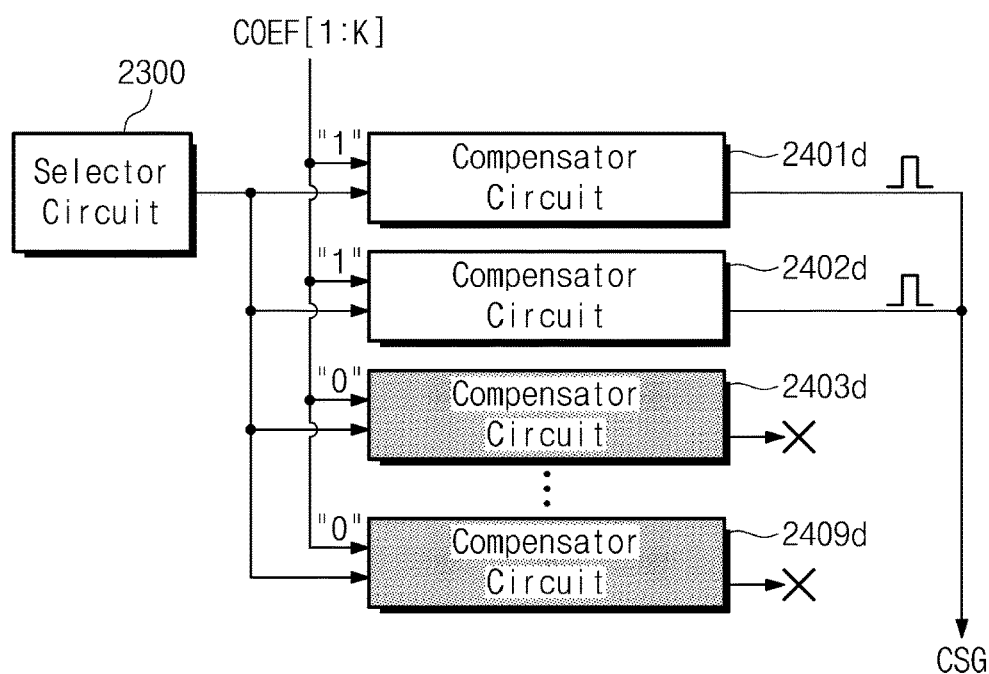
FIG. 18 is a block diagram for describing an operation of an electronic circuit of FIG. 17.

FIG. 17 is a block diagram illustrating a configuration associated with the electronic circuit 2000 of FIG. 11. FIG. 18 is a block diagram for describing an operation of an electronic circuit 2000d of FIG. 17.

In exemplary embodiments of the present inventive concept, the electronic circuit 2000 of FIG. 11 may include the electronic circuit 2000d of FIG. 17. Referring to FIG. 17, the electronic circuit 2000d may include the main driver 2100, the selector circuit 2300, and compensator circuits 2400d. Referring to FIG. 18, the compensator circuits 2400d may include "K" segmented compensator circuits 2401d to 2409d.

Referring to FIGS. 17 and 18, the compensator circuits 2401d to 2409d may receive the signal IN1 or the signal IN2 according to a selection of the selector circuit 2300. A configuration and an operation of each of the compensator circuits 2401d to 2409d may be substantially the same as the configuration and the operation of the compensator circuit 2400.

For example, each of the compensator circuits 2401d to 2409d may generate a compensation signal for compensating for an inter-symbol interference based on the signal IN1 or may generate a compensation signal for compensating for a crosstalk noise based on the signal IN2. The compensator circuits 2400d may output a final compensation signal CSG based on the compensation signals generated by the compensator circuits 2401d to 2409d.

The compensator circuits 2401d to 2409d may be controlled based on a control signal COEF[1:K]. For example, the control signal COEF[1:K] may include "K" control values, and the control values may respectively control operations of the compensator circuits 2401d to 2409d.

The compensator circuits 2401d to 2409d may be controlled to operate or not to operate, based on the control signal COEF[1:K]. A compensator circuit (e.g., the compensator circuits 2401d and 2402d of FIG. 18) that operates may output a compensation signal based on the signal IN1 or the signal IN2. The final compensation signal CSG may be output from the compensator circuit that operates.

In contrast, a compensator circuit (e.g., the compensator circuits 2403d and 2409d of FIG. 18) that does not operate may not output a compensation signal. For example, when elements (e.g., a switch or a transistor) included in a compensator circuit are turned off based on a control value or when a signal output path from the compensator circuit is disconnected based on a control value, a compensator circuit may be considered not to be operating.

Each of the compensator circuits 2401d to 2409d may be independently controlled based on the control signal COEF[1:K], to operate or not to operate, regardless of whether any other compensator circuit operates. For example, the compensator circuit 2401d may be controlled to operate in response to a control value having "1" among the control signal COEF[1:K], independently of the ease where the compensator circuit 2403d does not operate. The compensator circuit 2403d may be controlled not to operate based on a control value having "0" among the control signal COEF[1:K], independently of the case where the compensator circuit 2401d operates.

For example, the control signal COEF[1:K] may be provided to the compensator circuits based on whether an influence of a noise (e.g., a crosstalk noise or an inter-symbol interference) is great or small. Like the control signal CTL described with reference to FIGS. 15 and 16, the control signal COEF[1:K] may be determined or changed based on a test result or a monitoring result.

When the noise influence changes, the number of compensator circuits, which operate to generate the compensation signal CSG, from among the compensator circuits 2401d to 2409d may change. For example, the number of compensator circuits that operate may increase when the noise influence is great, and the number of compensator circuits that operate may decrease when the noise influence is small.

As the number of compensator circuits operating changes when the noise influence changes, a waveform of the compensation signal CSG may change. For example, when the number of compensator circuits operating increases, the waveform of the compensation signal CSG may change such that the degree to which the signal IN1 is compensated based on the compensation signal CSG increases. In contrast, when the number of compensator circuits operating decreases, the waveform of the compensation signal CSG may change such that the degree to which the signal IN1 is compensated based on the compensation signal CSG decreases.

As such, depending on a communication environment, the waveform of the compensation signal CSG may change based on the control signal COEF[1:K]. As the waveform of the compensation signal CSG changes, the degree of compensating for a noise may change. Accordingly, the electronic circuit 2000d may actively cope with a change in a communication environment.

Figure 19:
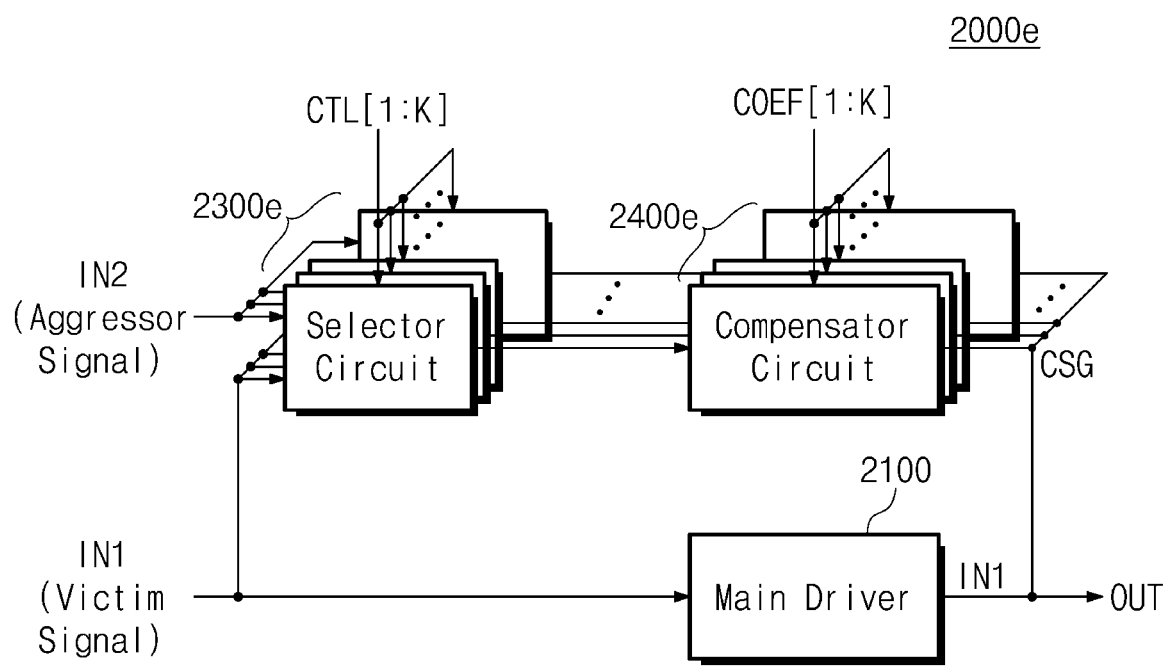
FIG. 19 is a block diagram illustrating a configuration associated with an electronic circuit of FIG. 11.
Figure 20:
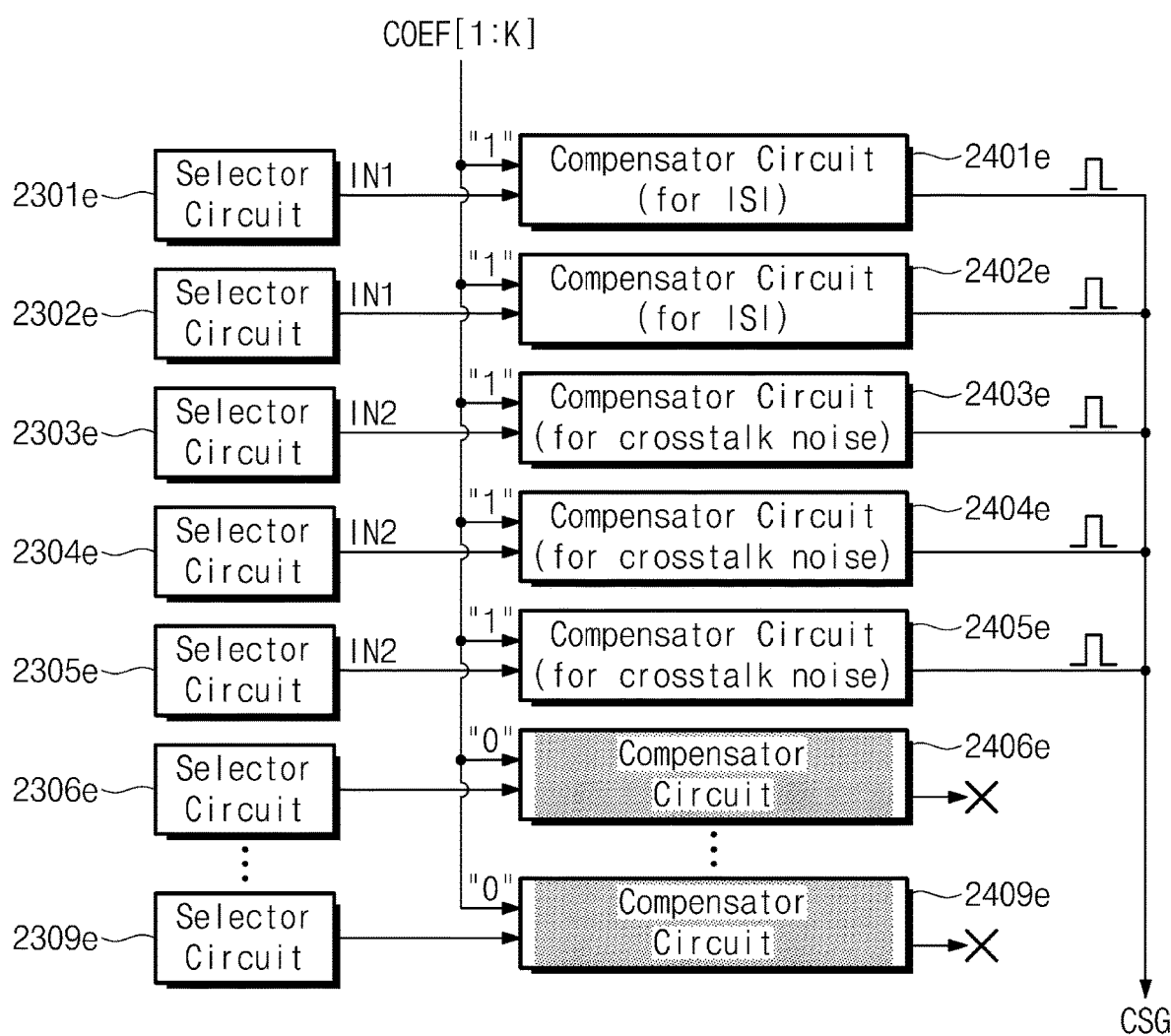
FIG. 20 is a block diagram for describing an operation of an electronic circuit of FIG. 19.

FIG. 19 is a block diagram illustrating a configuration associated with the electronic circuit 2000 of FIG. 11. FIG. 20 is a block diagram for describing an operation of an electronic circuit 2000e of FIG. 19.

In exemplary embodiments of the present inventive concept, the electronic circuit 2000 of FIG. 11 may include the electronic circuit 2000e of FIG. 19. Referring to FIG. 19, the electronic circuit 2000e may include the main driver 2100, selector circuits 2300e, and compensator circuits 2400e. Referring to FIG. 20, the selector circuits 2300e may include "K" selector circuits 2301e to 2309e, and the compensator circuits 2400e may include "K" compensator circuits 2401e to 2409e.

Referring to FIGS. 19 and 20, the selector circuits 2301e to 2309e may be controlled based on a control signal CTL[1:K]. For example, the control signal CTL[1:K] may include "K" control values, and the control values may be respectively provided to the selector circuits 2301e to 2309e.

Each of the selector circuits 2301e to 2309e may select the signal IN1 or the signal IN2 in response to a control value of the control signal CTL[1:K], and may provide the selected signal to the compensator circuits 2401e to 2409e. A configuration and an operation of each of the selector circuits 2301e to 2309e may be substantially the same as the configuration and the operation of the selector circuit 2300 of FIG. 11.

Each of the selector circuits 2301e to 2309e may independently select the signal IN1 or the signal IN2, regardless of whether any other selector circuit selects the signal IN1 or the signal IN2. For example, the selector circuit 2301e may select the signal IN1 based on a control value of the control signal CTL[1:K], independent from the selector circuit 2304e selecting the signal IN2. The selector circuit 2303e may select the signal IN2 based on a control value of the control signal CTL[1:K], independent from the selector circuit 2302e selecting the signal IN1.

The compensator circuits 2401e to 2409e may be respectively connected with the selector circuits 2301e to 2309e. Each of the compensator circuits 2401e to 2409e may generate a compensation signal based on the signal IN1 or the signal IN2 depending on an operation of a selector circuit connected thereto.

Operations of the compensator circuits 2401e to 2409e may be similar to the operations of the compensator circuits 2401d to 2409d of FIG. 18. Each of the compensator circuits 2401e to 2409e may be independently controlled based on the control signal COEF[1:K], to operate or not to operate, regardless of whether any other compensator circuit operates. For example, while the compensator circuits 2401e to 2405e operate, the compensator circuits 2406e to 2409e may not operate. For example, the compensator circuits 2401e to 2405e may operate in response to the control signal COEF[1:K] of a value "1" and the compensator circuits 2406e to 2409e may not operate in response to the control signal COEF[1:K] of a value "2".

In addition, a compensator circuit that operates may generate a compensation signal, and the final compensation signal CSG may be output from the operating compensator circuit. The control signal COEF[1:K] and the final compensation signal CSG may change with regard to an influence of a noise.

As the individual selector circuits 2301e to 2309e are connected, the compensator circuits 2401e to 2409e may receive different signals. In this case, the compensator circuits 2401e to 2409e may independently generate compensation signals, regardless of whether any other compensator circuit generates a compensation signal for compensating for an inter-symbol interference or a compensation signal for compensating for a crosstalk noise.

For example, when the selector circuit 2301e connected to the compensator circuit 2401e selects the signal IN1, the compensator circuit 2401e may generate a compensation signal to compensate for an inter-symbol interference based on the signal IN1. In contrast, when the selector circuit 2305e connected to the compensator circuit 2405e selects the signal IN2, the compensator circuit 2405e may generate a compensation signal to compensate for a crosstalk noise based on the signal IN2.

As such, for example, each of the compensator circuits 2401e to 2402e may generate a compensation signal to compensate for an inter-symbol interference based on the signal IN1 and each of the compensator circuits 2403e to 2405e and may simultaneously generate a compensation signal to compensate for a crosstalk noise based on the signal IN2. In this case, it is possible to compensate for the inter-symbol interference and the crosstalk noise at the same time.

The degree of compensating for the inter-symbol interference based on the compensation signal CSG may vary with the number of compensator circuits receiving the signal IN1. The degree of compensating for the crosstalk noise based on the compensation signal CSG may vary with the number of compensator circuits receiving the signal IN2. Depending on signals selected by the selector circuits 2301e to 2309e, the degree of compensating for the inter-symbol interference may be the same as or different from the degree of compensating for the crosstalk noise.

Signals selected by the selector circuits 2301e to 2309e may be determined based on the control signal CTL[1:K]. Accordingly, the degree of compensating for the inter-symbol interference and the degree of compensating for the crosstalk noise may change based on the control signal CTL[1:K]Like the control signal CTL described with reference to FIGS. 15 and 16, the control signal CTL[1:K] may be determined or changed based on a test result or a monitoring result.

In some cases, the compensator circuits 2401e to 2409e may receive the same signal, and may output compensation signals to compensate for the same noise. In this case, operations of the compensator circuits 2401e to 2409e may be similar to the operations of the compensator circuits 2401d to 2409d of FIGS. 17 and 18.

Figure 21:
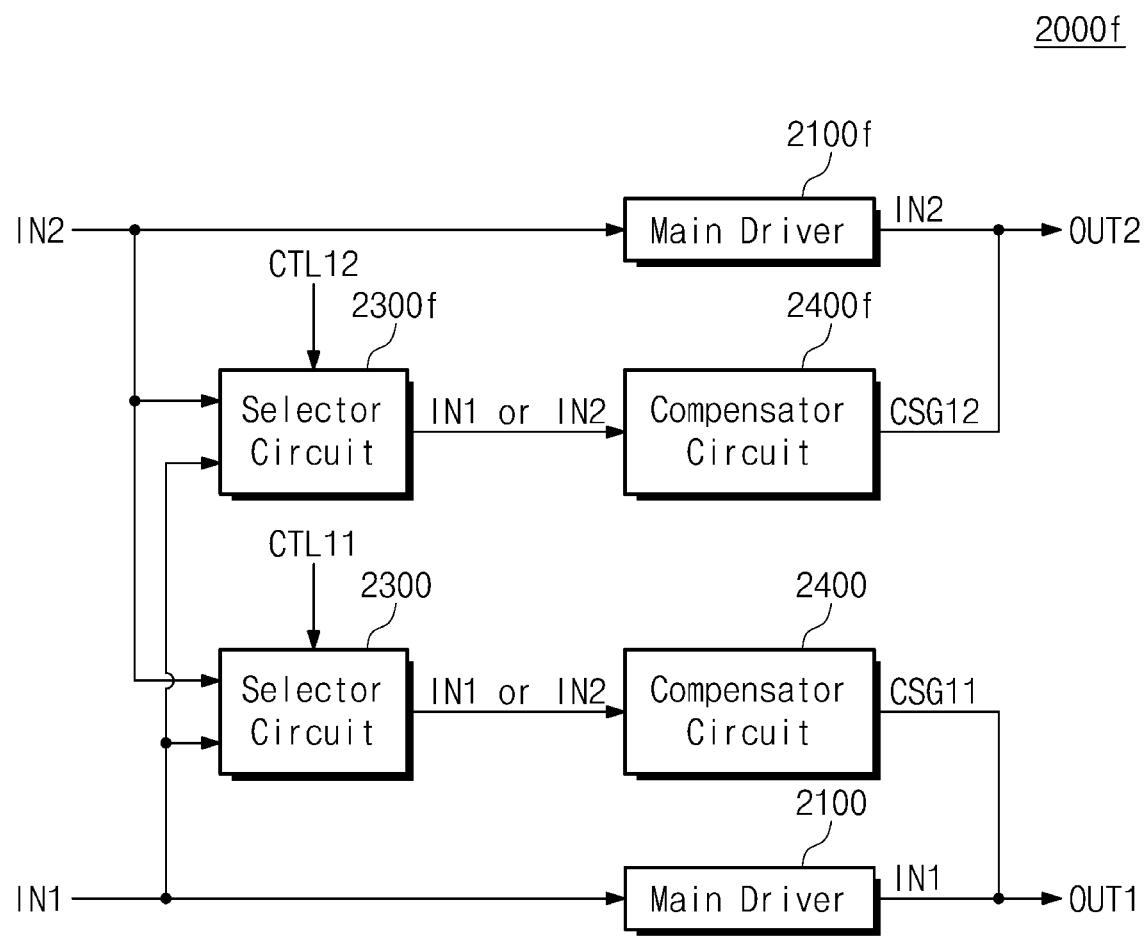
FIGS. 21 and 22 are block diagrams illustrating configurations associated with an electronic circuit of FIG. 11.

FIG. 21 is a block diagram illustrating a configuration associated with the electronic circuit 2000 of FIG. 11.

In exemplary embodiments of the present inventive concept, the electronic circuit 2000 of FIG. 11 may include an electronic circuit 2000f of FIG. 21. The electronic circuit 2000f may include main drivers 2100 and 2100f, selector circuits 2300 and 2300f, and compensator circuits 2400 and 2400f.

The embodiments of FIGS. 3 to 20 describe that the signal IN1 has an influence of a crosstalk noise caused with regard to the signal IN2. The signal IN2 may be affected by the crosstalk noise caused with regard to the signal IN1. The electronic circuit 2000f may compensate for a mutual crosstalk noise between the signal IN1 and the signal IN2.

The selector circuit 2300 may select the signal IN1 or the signal IN2 in response to a control signal CTL11, and the compensator circuit 2400 may generate a compensation signal CSG11 based on a signal selected by the selector circuit 2300. An output signal OUT1 may be generated by applying the compensation signal CSG11 to the signal IN1 driven by the main driver 2100. The output signal OUT1 may correspond to data that are intended to be transferred by the signal IN1.

The main driver 2100f may drive the signal IN2 to output the driven signal IN2. The selector circuit 2300f may select the signal IN1 or the signal IN2 in response to a control signal CTL12. The selector circuit 2300f may select the signal IN1 or the signal IN2 independently of the selector circuit 2300, regardless of whether the selector circuit 2300 selects the signal IN1 or the signal IN2. The control signal CTL12 and the selection of the selector circuit 2300f may be based on a type and influence of a noise associated with the signal IN2.

The compensator circuit 2400f may generate a compensation signal CSG12 for compensating the driven signal IN2, based on a signal selected by the selector circuit 2300f. In the case where the selector circuit 2300f selects the signal IN1, the compensator circuit 2400f may generate the compensation signal CSG12 to compensate for a crosstalk noise of the driven signal IN2 caused by the driven signal IN1, based on the signal IN1.

In the case where the selector circuit 2300f selects the signal IN2, the compensator circuit 2400f may generate the compensation signal CSG12 to compensate for an inter-symbol interference of the driven signal IN2, based on the signal IN2. An output signal OUT2 may be generated by applying the compensation signal CSG12 to the driven signal IN2. The output signal OUT2 may correspond to data that are intended to be transferred by the signal IN2.

Figure 22:
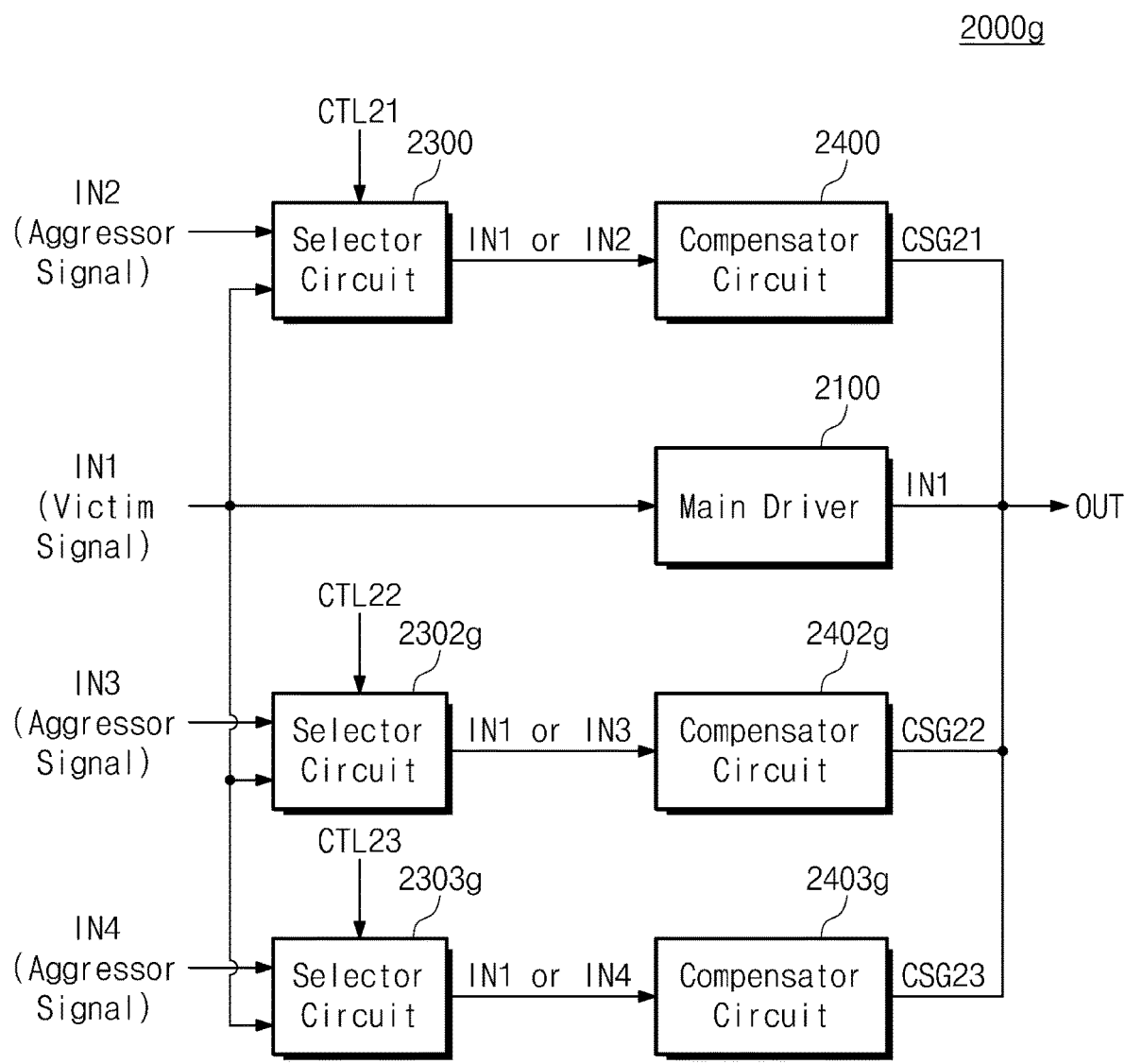

FIG. 22 is a block diagram illustrating a configuration associated with the electronic circuit 2000 of FIG. 11.

In exemplary embodiments of the present inventive concept, the electronic circuit 2000 of FIG. 11 may include an electronic circuit 2000g of FIG. 22. The electronic circuit 2000g may include the main driver 2100, selector circuits 2300, 2302g, and 2303g, and compensator circuits 2400, 2402g, and 2403g.

The embodiments of FIGS. 3 to 21 describe that the signal IN1 has an influence of only a crosstalk noise caused with regard to the signal IN2. In an actual operation, a crosstalk noise of the signal IN1 may be caused with regard to a plurality of signals (e.g., signals IN2, IN3, and IN4).

The signals IN2, IN3, and IN4 may be received in parallel from an SER/DES. For example, the signals IN1, IN2, IN3, and IN4 may correspond to signals to be transferred through communication channels that are adjacent to each other in space or are close to each other in distance. The electronic circuit 2000g may compensate for a crosstalk noise of the signal IN1 caused by the signals IN2, IN3, and IN4. In this regard, the signal IN1 may be a victim signal, and the signals IN2, IN3, and IN4 may be an aggressor signal.

The selector circuit 2300 may select the signal IN1 or the signal IN2 in response to a control signal CTL21. The compensator circuit 2400 may generate a compensation signal CSG21 based on a signal selected by the selector circuit 2300.

The selector circuit 2302g may select the signal IN1 or the signal IN3 in response to a control signal CTL22. The compensator circuit 2402g may generate a compensation signal CSG22 for compensating the driven signal IN1, based on a signal selected by the selector circuit 2302g.

When the selector circuit 2302g selects the signal IN1, the compensator circuit 2402g may generate the compensation signal CSG22 to compensate for an inter-symbol interference of the driven signal IN1, based on the signal IN1. When the selector circuit 2302g selects the signal IN3, the compensator circuit 2402g may generate the compensation signal CSG22 to compensate for a crosstalk noise of the driven signal IN1 caused by a signal driven from the signal IN3, based on the signal IN3.

The selector circuit 2303g may select the signal IN1 or the signal IN4 in response to a control signal CTL23. The compensator circuit 2403g may generate a compensation signal CSG23 to compensate for an inter-symbol interference of the driven signal IN1 or a crosstalk noise of the signal IN4, based on a signal selected by the selector circuit 2303g.

The selector circuit 2302g may select the signal IN1 or the signal IN3 independently of the selector circuit 2300, regardless of whether the selector circuit 2300 selects the signal IN1 or the signal IN2. The selector circuit 2303g may select the signal IN1 or the signal IN4 independently of the selector circuits 2300 and 2302g, regardless of whether the selector circuits 2300 and 2302g select the signal IN1 or the signal IN2 or IN3.

As understood from FIGS. 21 and 22, the electronic circuit 2000 for selectively compensating for noises may be provided between the communication channels CH11 to CH19 and CH21 to CH29. In addition, the embodiments described with reference to FIGS. 11 to 22 are described independently of each other, but it is to be understood that two or more of the embodiments may be combined.

Figure 23:
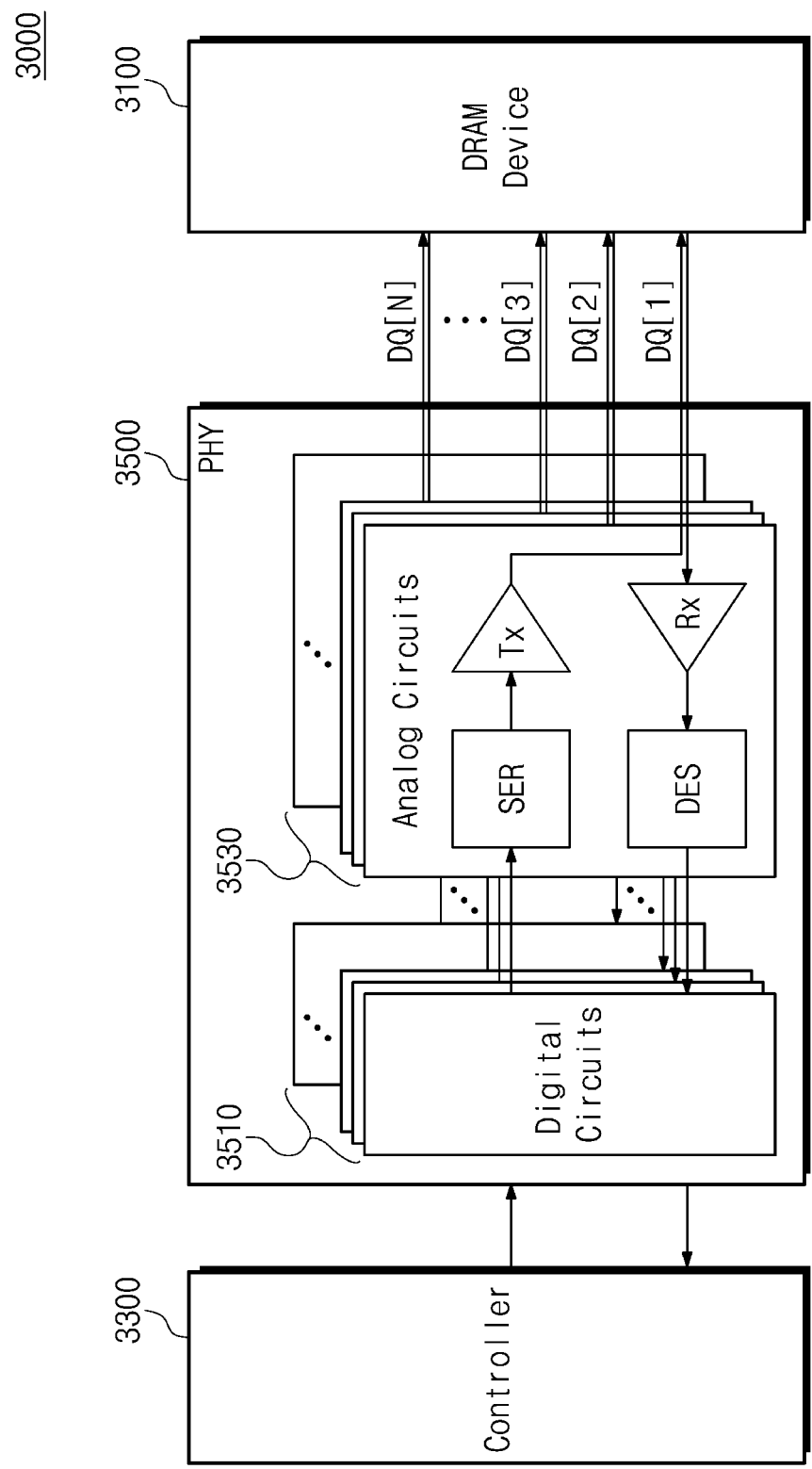
FIG. 23 is a block diagram illustrating a configuration of a memory system including an electronic circuit of FIG. 11.

FIG. 23 is a block diagram illustrating a configuration of a memory system 3000 including the electronic circuit 2000 of FIG. 11.

The memory system 3000 may include a memory device (e.g., a dynamic random access memory (DRAM) device 3100) and a memory controller (e.g., a controller 3300). The DRAM device 3100 may store data or may output the stored data. The controller 3300 may control the DRAM device 3100 such that the DRAM device 3100 stores or outputs data.

The memory system 3000 may include a physical layer (PHY) 3500. The PHY 3500 may include physical circuits for transferring a data signal between the DRAM device 3100 and the controller 3300. The physical circuits may include digital circuits 3510 and analog circuits 3530.

Data processed by the digital circuits 3510 may be provided to an SER of each of the analog circuits 3530. Data processed by a DES of each of the analog circuits 3530 may be provided to the digital circuits 3510.

In each of the analog circuits 3530, the SER may serialize data and may provide the serialized data to a transmitter Tx, and the transmitter Tx may transmit a signal corresponding to the serialized data to the DRAM device 3100. A receiver Rx may provide a signal received from the DRAM device 3100 to the DES, and the DES may deserialize data of the received signal.

DQ signals DQ[1] to DQ[N] may be conveyed between the analog circuits 3530 and the DRAM device 3100. With regard to transmitting the DQ signals DQ[1] to DQ[N] to the DRAM device 3100, each of the analog circuits 3530 may use the electronic circuit 2000 to selectively compensating for different types noises (e.g., a crosstalk noise and an inter-symbol interference).

For example, when the memory system 3000 is included in a processor device including a graphic processing unit (GPU), the DQ signals DQ[1] to DQ[N] may be conveyed in parallel in a graphic double data rate (GDDR) technique. However, the present inventive concept is not limited thereto, it is to be understood that the electronic circuit 2000 may be variously changed or modified such that the electronic circuit 2000 is applied to a different type of communication technique and a different type of an electronic system.

According to exemplary embodiments of the present inventive concept, signal distortion due to a crosstalk noise or an inter-symbol interference may decrease. For example, exemplary embodiments of the present inventive concept provide an electronic circuit for compensating for a noise occurring in a communication channel during data transmission. In the exemplary embodiments of the present inventive concept, the electronic circuit may selectively compensate for a cross-talk noise and an inter-symbol interference. In the exemplary embodiments of the present inventive concept, as a compensator circuit is shared to provide compensation of the crosstalk noise and compensation of the inter-symbol interference, a circuit area may decrease.

While the present inventive concept has been described with reference to exemplary embodiments thereof, it will be apparent to those of ordinary skill in the art that various changes and modifications may be made thereto without departing from the spirit and scope of the present inventive concept as set firth in the following claims.

What is claimed is:

1. An electronic circuit, comprising:
   a first driver for outputting a driven first signal by driving a first signal among signals received in parallel;
   a first selector circuit for selecting one of the first signal and a second signal among the signals; and
   a first compensator circuit for generating a first compensation signal for compensating the driven first signal, in response to the signal selected by the first selector circuit,
   wherein, when the first selector circuit selects the first signal, the first compensator circuit generates the first compensation signal to compensate for an inter-symbol interference of the driven first signal, and
   wherein, when the first selector circuit selects the second signal, the first compensator circuit generates the first compensation signal to compensate for a crosstalk noise of the driven first signal caused by a driven second signal driven from the second signal.

2. The electronic circuit of claim 1, wherein the driven first signal and the driven second signal are respectively transferred to adjacent parallel channels.

3. The electronic circuit of claim 1, further comprising:
   a second driver for outputting the driven second signal by driving the second signal;
   a second selector circuit for selecting one of the first signal and the second signal; and
   a second compensator circuit for generating a second compensation signal for compensating the driven second signal, based on the one signal selected by the second selector circuit.

4. The electronic circuit of claim 3, wherein, when the second selector circuit selects the second signal, the second compensator circuit generates the second compensation signal to compensate for an inter-symbol interference of the driven second signal, and
   wherein, when the second selector circuit selects the first signal, the second compensator circuit generates the second compensation signal to compensate for a crosstalk noise of the driven first signal caused by the driven first signal.

5. The electronic circuit of claim 3, wherein the second selector circuit selects the first signal or the second signal independently of the first selector circuit, regardless of whether the first selector circuit selects the first signal or the second signal.

6. The electronic circuit of claim 1, further comprising:
   a third selector circuit for selecting one of the first signal and a third signal among the signals; and
   a third compensator circuit for generating a third compensation signal for compensating the driven first signal, based on the signal selected by the third selector circuit.

7. The electronic circuit of claim 6, wherein, when the third selector circuit selects the first signal, the third compensator circuit generates the third compensation signal to compensate for the inter-symbol interference of the driven first signal, and
   wherein, when the third selector circuit selects the third signal, the third compensator circuit generates the third compensation signal to compensate for a crosstalk noise of the driven first signal caused by a driven third signal driven from the third signal.

8. The electronic circuit of claim 6, wherein the third selector circuit selects the first signal or the third signal independently of the first selector circuit, regardless of whether the first selector circuit selects the first signal or the second signal.

9. The electronic circuit of claim 1, wherein the first selector circuit selects the first signal and the second signal in response to a control signal, and
   wherein the control signal is based on an influence of the inter-symbol interference of the driven first signal or an influence of the crosstalk noise of the driven first signal.

10. An electronic circuit for transmitting an output signal, comprising:
    a driver for receiving a first signal and outputting a driven first signal; and
    a compensator circuit for receiving one selected from the first signal and a second signal received in parallel with the first signal, and for outputting a first compensation signal to compensate for an inter-symbol interference of the driven first signal in response to the first signal or for outputting a second compensation signal to compensate for a crosstalk noise of the driven first signal in response to the second signal.

11. The electronic circuit of claim 10, wherein the crosstalk noise is caused by a driven second signal driven from the second signal,
    wherein the first compensation signal has a waveform to compensate for a distortion of a waveform of the driven first signal due to the inter-symbol interference, and
    wherein the second compensation signal has a waveform to compensate for the distortion of the waveform of the driven first signal due to the crosstalk noise.

12. The electronic circuit of claim 10, wherein the compensator circuit includes:
    a differentiator circuit for processing the first signal or the second signal such that the first compensation signal or the second compensation signal has a waveform obtained by differentiating a waveform of the first signal or the second signal, and wherein the differentiator circuit is configured to process the first signal and the second signal.

13. The electronic circuit of claim 10, wherein the first compensation signal includes a first pulse corresponding to a waveform obtained by differentiating a waveform of the first signal, and wherein a direction in which the first pulse compensates for a waveform of the driven first signal is opposite to a direction in which the waveform of the driven first signal is distorted due to the inter-symbol interference.

14. The electronic circuit of claim 10, wherein the second compensation signal includes a second pulse corresponding to a waveform obtained by differentiating a waveform of the second signal, and wherein a direction in which the second pulse compensates for a waveform of the driven first signal is opposite to a direction in which the waveform of the driven first signal is distorted due to the crosstalk noise.

15. The electronic circuit of claim 10, wherein the first compensation signal includes a first pulse corresponding to a waveform obtained by differentiating a waveform of the first signal, the second compensation signal includes a second pulse corresponding to a waveform obtained by differentiating a waveform of the second signal, and wherein a direction in which the first pulse compensates for a waveform of the driven first signal is the same as a direction in which the second pulse compensates for the waveform of the driven first signal.

16. The electronic circuit of claim 10, wherein the compensator circuit receives the first signal when an influence of the inter-symbol interference is greater than an influence of the crosstalk noise and receives the second signal when the influence of the crosstalk noise is greater than the influence of the inter-symbol interference.

17. The electronic circuit of claim 10, wherein the electronic circuit outputs the output signal in response to the driven first signal compensated based on the first compensation signal or the second compensation signal, and wherein the driver and the compensator circuit are connected in parallel between a terminal for receiving the first signal and a terminal for outputting the output signal.

18. An electronic circuit, comprising:
a driver for driving a first signal of signals received in parallel;
a selector circuit for selecting one of the first signal and a second signal among the signals; and
a compensator circuit for compensating for a first noise occurring in the driven first signal in response to the first signal selected by the selector circuit or compensating for a second noise of the driven first signal caused with regard to the second signal in response to the second signal selected by the selector circuit.

19. The electronic circuit of claim 18, wherein, when an influence of the first noise or the second noise of the driven first signal changes, a degree to which the compensator circuit compensates for the first noise or the second noise changes.

20. The electronic circuit of claim 18, wherein the first signal and the second signal are associated with DQ signals to be transmitted to a memory device in a graphic double data rate (GDDR) technique.

* * * * *